(12) United States Patent
Lee et al.

(10) Patent No.: US 11,659,743 B2
(45) Date of Patent: *May 23, 2023

(54) DISPLAY PANEL

(71) Applicant: Samsung Display Co., Ltd., Yongin-si (KR)

(72) Inventors: Wonse Lee, Yongin-si (KR); Jintae Jeong, Yongin-si (KR); Jihyun Ka, Yongin-si (KR); Hwayoung Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 83 days.

This patent is subject to a terminal disclaimer.

(21) Appl. No.: 17/232,785

(22) Filed: Apr. 16, 2021

(65) Prior Publication Data

US 2021/0233991 A1 Jul. 29, 2021

Related U.S. Application Data

(63) Continuation of application No. 16/357,802, filed on Mar. 19, 2019, now Pat. No. 11,011,595.

(30) Foreign Application Priority Data

Aug. 2, 2018 (KR) .......................... 10-2018-0090453

(51) Int. Cl.
*H10K 59/131* (2023.01)
*H10K 50/84* (2023.01)
(Continued)

(52) U.S. Cl.
CPC ........ *H01L 27/3276* (2013.01); *H01L 51/524* (2013.01)

(58) Field of Classification Search
None
See application file for complete search history.

(56) References Cited

U.S. PATENT DOCUMENTS 8,890,181 B2 11/2014 Wang et al.
9,940,888 B2 4/2018 Ryoo et al.
(Continued)

FOREIGN PATENT DOCUMENTS

JP 2014-134766 7/2014
KR 10-2008-0045637 5/2008
(Continued)

*Primary Examiner* — Telly D Green
(74) *Attorney, Agent, or Firm* — Kile Park Reed & Houtteman PLLC

(57) ABSTRACT

A display panel includes a substrate having a non-display area surrounding an opening area, and a display area outside the non-display area, a plurality of display elements arranged in the display area, a plurality of first lines extending in a first direction and bypassing the opening area along an edge of the opening area, a plurality of second lines extending in a second direction that crosses the first direction and, the plurality of second lines bypassing the opening area along the edge of the opening area, and a plurality of third lines extending in the second direction and bypassing the opening area along the edge of the opening area, at least one of the plurality of third lines including a circuitous portion between neighboring first lines of the plurality of first lines in the non-display area.

25 Claims, 22 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 10,109,649 B2 | 10/2018 | Jang | |
| 10,134,826 B2 * | 11/2018 | Ka | ............ H01L 51/56 |
| 10,304,913 B2 | 5/2019 | Choi et al. | |
| 10,546,534 B2 | 1/2020 | Lee et al. | |
| 10,700,155 B2 * | 6/2020 | Ka | ........ H01L 27/3276 |
| 11,011,595 B2 * | 5/2021 | Lee | ........ H01L 51/524 |
| 2007/0120812 A1 | 5/2007 | Nagayama | |
| 2008/0225216 A1 | 9/2008 | Shimodaira | |
| 2013/0003006 A1 | 1/2013 | Wang et al. | |
| 2013/0258234 A1 | 10/2013 | Park et al. | |
| 2014/0197428 A1 | 7/2014 | Wang et al. | |
| 2017/0154566 A1 | 6/2017 | Ryoo et al. | |
| 2017/0162637 A1 | 6/2017 | Choi et al. | |
| 2017/0294502 A1 * | 10/2017 | Ka | ........ H01L 27/3276 |
| 2018/0076416 A1 | 3/2018 | Cho et al. | |
| 2018/0090718 A1 | 3/2018 | Lee et al. | |
| 2019/0074346 A1 * | 3/2019 | Ka | ........ H01L 27/3248 |
| 2019/0305072 A1 | 10/2019 | Park et al. | |
| 2020/0006701 A1 | 1/2020 | Lee et al. | |
| 2020/0058728 A1 | 2/2020 | Song et al. | |
| 2020/0110495 A1 | 4/2020 | Han et al. | |
| 2020/0312944 A1 * | 10/2020 | Ka | ............ H01L 51/56 |
| 2021/0057515 A1 * | 2/2021 | Ka | ........ H01L 27/3262 |

FOREIGN PATENT DOCUMENTS

| | | |
|---|---|---|
| KR | 10-2013-0109709 | 10/2013 |
| KR | 10-2017-0031850 | 3/2017 |
| KR | 10-2017-0064598 | 6/2017 |
| KR | 10-2017-0066767 | 6/2017 |
| KR | 10-2017-0117291 | 10/2017 |

* cited by examiner

DISPLAY PANEL

CROSS-REFERENCE TO RELATED APPLICATION(S)

This is a continuation application of U.S. patent application Ser. No. 16/357,802 filed Mar. 19, 2019 (now U.S. Pat. No. 11,011,595), the disclosure of which is incorporated herein by reference in its entirety. U.S. patent application Ser. No. 16/357,802 claims priority benefit of Korean Patent Application 10-2018-0090453 filed Aug. 2, 2018, in the Korean Intellectual Property Office, the disclosure of which is incorporated herein by reference in its entirety for all purposes.

BACKGROUND

1. Field

One or more embodiments relate to a display panel and a display device including the same.

2. Description of the Related Art

Recently, the purposes of a display device have become more diversified. Also, as a display device is thin and lightweight, a range of uses thereof has gradually been extended. As a display device is variously utilized, various methods may be used in designing a shape of the display device, and also, functionality that may be combined or made cooperate with the display device increases.

SUMMARY

According to one or more embodiments, a display panel may include a substrate having a non-display area surrounding an opening area, and a display area outside the non-display area, a plurality of display elements arranged in the display area, a plurality of first lines extending in a first direction and bypassing the opening area along an edge of the opening area, a plurality of second lines extending in a second direction that crosses the first direction and, the plurality of second lines bypassing the opening area along the edge of the opening area, and a plurality of third lines extending in the second direction and bypassing the opening area along the edge of the opening area, at least one of the plurality of third lines including a circuitous portion between neighboring first lines of the plurality of first lines in the non-display area.

The circuitous portion of the at least one of the plurality of third lines may be arranged between circuitous portions of the neighboring first lines.

At least one of the plurality of second lines may include a circuitous portion located between the neighboring first lines in the non-display area.

The circuitous portion of the at least one of the plurality of third lines may be spaced apart from the circuitous portion of at least one of the plurality of second lines.

The plurality of third lines may have a constant voltage.

The at least one of the plurality of third lines may further include an auxiliary line that extends opposite to the circuitous portion.

The auxiliary line may be connected to the at least one of the plurality of third lines.

A pitch between the neighboring first lines in the non-display area may be less than a pitch between the neighboring first lines in the display area.

The display panel may further include: an encapsulation substrate covering the display elements and facing the substrate; and a sealing material surrounding the opening area between the substrate and the encapsulation substrate.

The display panel may further include an electrode layer arranged in the non-display area, the electrode layer including a hole corresponding to the opening area.

The electrode layer may have a constant voltage.

The electrode layer may cover at least a part of the plurality of first lines, the plurality of second lines, and the plurality of third lines.

According to one or more embodiments, a display panel may include a substrate including a non-display area surrounding an opening area, and a display area surrounding the non-display area, a plurality of display elements arranged over the display area; a plurality of voltage lines arranged over the substrate and bypassing along an edge of the opening area in the non-display area, a plurality of signal lines arranged over the substrate and bypassing along the edge of the opening area in the non-display area; and an encapsulation member covering the display elements, wherein at least one of the plurality of voltage lines includes a circuitous portion located between neighboring signal lines in the non-display area.

The signal lines may include data lines that extend to cross the plurality of voltage lines.

At least one of the plurality of voltage lines may further include an auxiliary line that extends opposite to the circuitous portion.

The signal lines may include scan lines that extend in a same direction as the plurality of voltage lines.

The circuitous portion of the at least one of the voltage lines may not overlap circuitous portions of the neighboring signal lines.

The display panel may further include an insulating layer arranged between the plurality of signal lines and the plurality of voltage lines.

The display panel may further include an electrode layer having a ring shape, being arranged in the non-display area, and including a hole corresponding to the opening area.

The voltage lines may have a constant voltage level.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
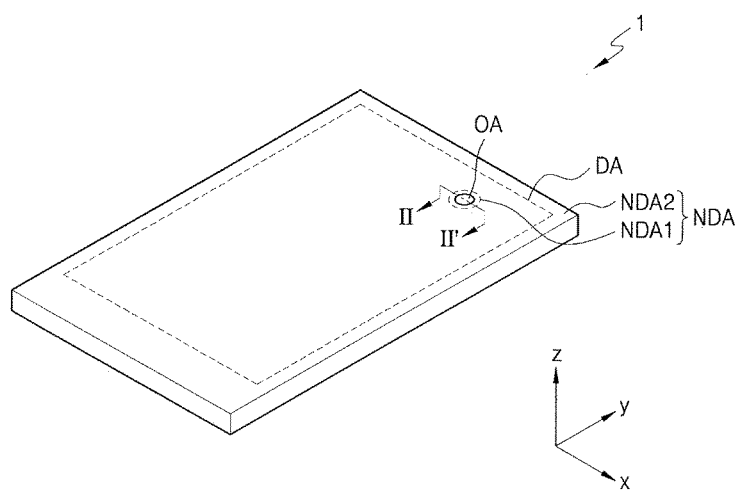
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise. It will be further understood that the terms "comprises/includes" and/or "comprising/including" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Embodiments may prevent a wiring, etc. arranged outside a display area from being viewed due to external light. However, it should be understood that effects described herein should be considered in a descriptive sense only and not for limitation of the disclosure.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a perspective view of a display device 1 according to an embodiment.

Referring to FIG. 1, the display device 1 may include a display area DA that emits light, and a non-display area NDA that does not emit light. The display device 1 may provide a predetermined image by using light emitted from a plurality of pixels arranged in the display area DA.

The display device 1 may include an opening area OA. The opening area OA may be at least partially surrounded by the display area DA. In an embodiment, FIG. 1 illustrates that the opening area OA is entirely surrounded by the display area DA. The non-display area NDA may include a first non-display area NDA1 surrounding the opening area OA, and a second non-display area NDA2 surrounding an outer periphery of the display area DA. For example, the first non-display area NDA1 may entirely surround, e.g., a perimeter of, the opening area OA, the display area DA may entirely surround, e.g., a perimeter of, the first non-display area NDA1, and the second non-display area NDA2 may entirely surround, e.g. a perimeter of, the display area DA.

The opening area OA may be an area in which an electronic element is disposed. The opening area OA may be understood as a transmission area through which light and/or sounds, which are output from the electronic element to the outside or propagate toward the electronic element from the outside, may pass. In an embodiment, in the case where light passes through the opening area OA, light transmittance may be about 50% or more, e.g., about 70% or more, about 75% or more, about 80% or more, about 85% or more, or about 90% or more.

Though an organic light-emitting display device is exemplarily described as the display device 1 according to an embodiment below, the display device is not limited thereto. In another embodiment, various types of display devices, e.g., an inorganic light-emitting display and a quantum dot light-emitting display, may be used.

Though FIG. 1 illustrates that the opening area OA is arranged at one side (upper right side) of the display area DA, which is a quadrangle, the embodiment is not limited thereto. A shape of the display area DA may be, e.g., a circle, an ellipse, or a polygon such as a triangle or a pentagon, and a location of the opening area OA may change variously.

Figure 2A:
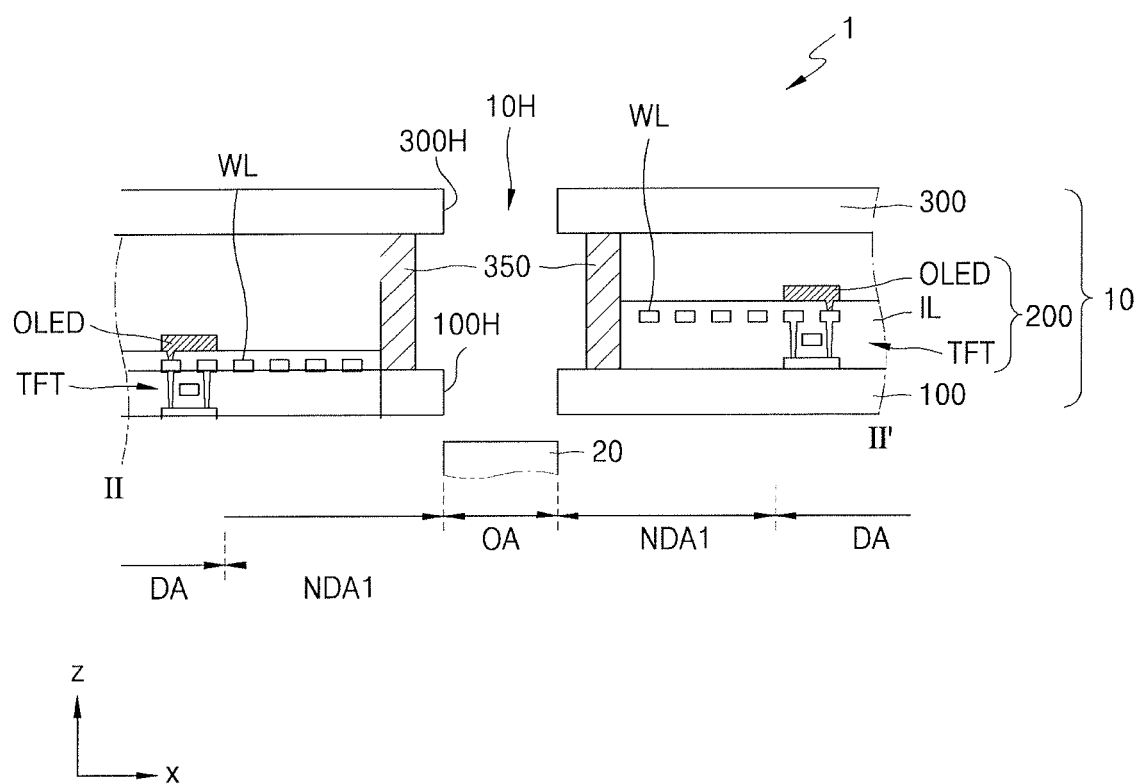
FIGS. 2A to 2C illustrate cross-sectional views of a display device according to an embodiment.
Figure 2B:
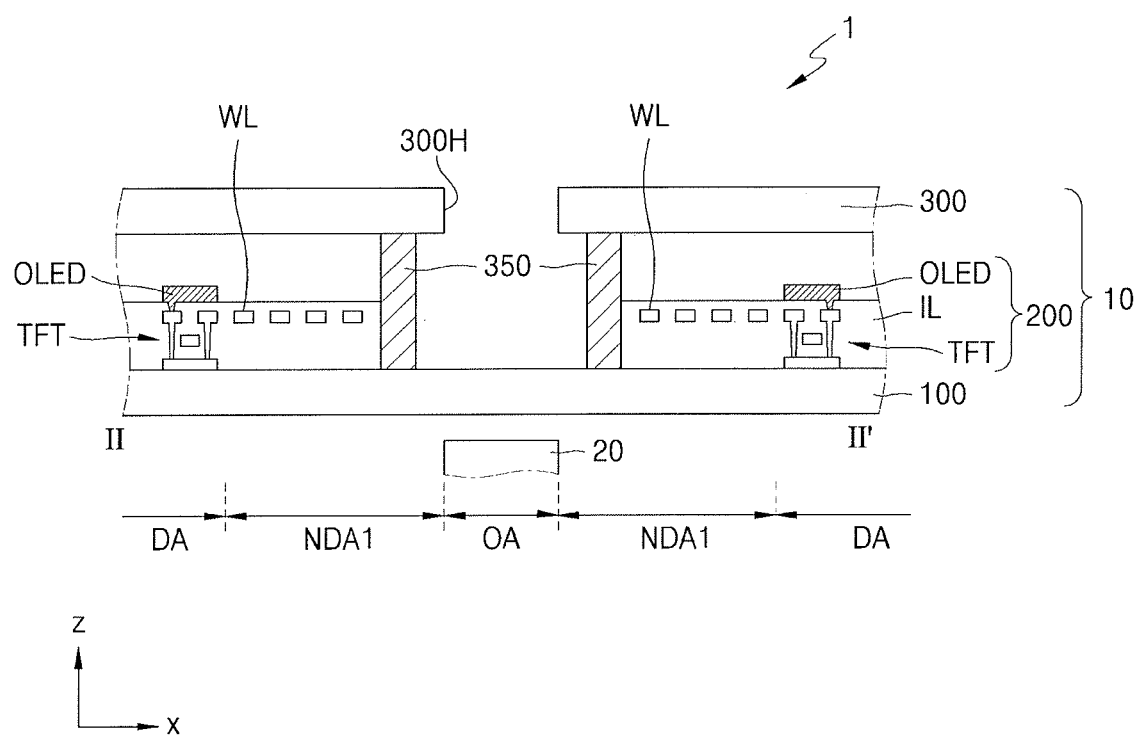
Figure 2C:
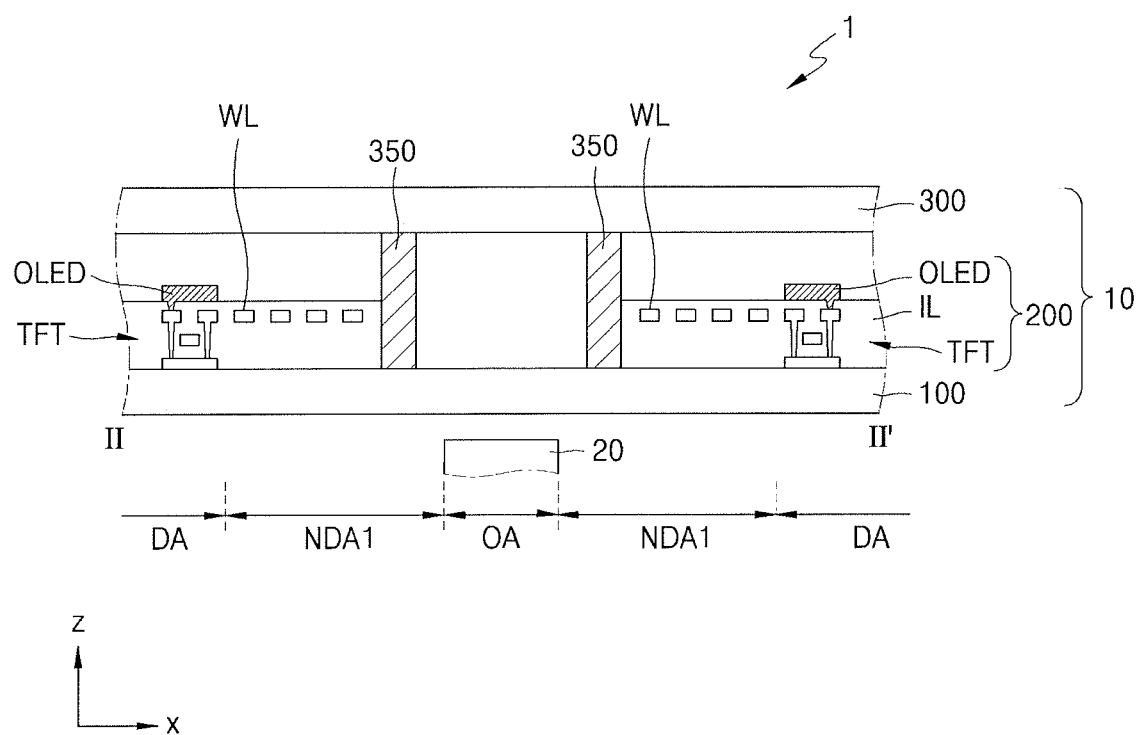

FIGS. 2A to 2C are cross-sectional views of the display device 1 according to an embodiment. FIGS. 2A to 2C correspond to a cross-section taken along line II-IP of FIG. 1.

Referring to FIG. 2A, the display device 1 may include a display panel 10 including a display element, and a component 20 corresponding to the opening area OA.

The display panel 10 may include a substrate 100, an encapsulation substrate 300 as an encapsulation member facing the substrate 100, and a display element layer 200 arranged therebetween. A sealing material (sealant) 350 surrounding a lateral surface of the display element layer 200 may be arranged between the substrate 100 and the encapsulation substrate 300. Though FIG. 2A illustrates that the sealing material 350 is arranged at two opposite sides of the opening area OA, it may be understood that the opening area OA is entirely surrounded by the sealing material 350 when viewed in a direction perpendicular to a main surface of the substrate 100.

The substrate 100 may include, e.g., glass or a polymer resin. The polymer resin may include, e.g., polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including the polymer resin may have a flexible, rollable, or bendable characteristic. The substrate 100 may have a multi-layered structure including a layer including the above-described polymer resin and an inorganic layer. For example, the substrate 100 may include a first resin layer, a first inorganic layer, a second resin layer, and a second inorganic layer that are sequentially stacked. The encapsulation substrate 300 may include, e.g., glass or the above-described polymer resin.

The display element layer 200 may include a circuit layer including a thin film transistor TFT, an organic light-emitting diode (OLED) as a display element connected to the thin film transistor TFT, and at least one insulating layer IL therebetween. The thin film transistor TFT and the OLED connected thereto may be arranged in the display area DA, and some wirings WL of the display element layer 200 may be located in the first non-display area NDA1 (e.g., the first non-display area NDA1 is between the opening area OA and the dashed circle in FIG. 4). The wirings WL may provide a predetermined signal or voltage to pixels spaced apart from each other with the opening area OA therebetween. Though FIG. 2A illustrates that the wirings WL do not overlap the sealing material 350 in the first non-display area NDA1, a portion of the sealing material 350 may be arranged also over the wirings WL.

The display panel 10 may include a through hole 10H corresponding to, e.g., overlapping, the opening area OA. For example, the substrate 100 and the encapsulation substrate 300 may respectively include through holes 100H and 300H corresponding to, e.g., overlapping, the opening area OA. Also, the display element layer 200 may include a through hole corresponding to the opening area OA.

An additional element, e.g., an input detector configured to detect a touch input, a reflection prevention member including a polarizer, a retarder, a color filter and/or a black matrix, and a transparent window may be further arranged over the display panel 10. For example, the additional element may be positioned on the encapsulation substrate 300, e.g., to have the encapsulation substrate 300 between the display element layer 200 and the additional element.

The component 20 may be located in the opening area OA. The opening area OA may be a component area (e.g., a camera area, a sensor area, a speaker area, etc.). The component 20 may be an electronic element that uses light or sounds. For example, an electronic element may be a sensor, e.g., an infrared sensor that receives and uses light, a camera that receives light and captures an image, a sensor that outputs and senses light or sounds to measure a distance or recognize a fingerprint, a small lamp that outputs light, or a speaker that outputs sounds. An electronic element may use light in various wavelength bands, e.g., visible light, infrared light, and ultraviolet light. In the case where the display panel 10 includes the through hole 10H corresponding to the opening area OA, light or sounds output or received by an electronic element may be more effectively utilized.

Unlike FIG. 2A in which the display panel 10 includes the through hole 10H corresponding to the opening area OA, some elements of the display panel 10 may not include a through hole. For example, as illustrated in FIG. 2B, though the encapsulation substrate 300 includes the through hole 300H corresponding to the opening area OA, the substrate 100 may not include a through hole. Alternatively, as illustrated in FIG. 2C, both the substrate 100 and the encapsulation substrate 300 may not include through holes corresponding to the opening area OA. As illustrated in FIGS. 2B and 2C, even though the substrate 100 does not include the through hole 100H, portions of the display element layer 200 corresponding to the opening area OA are removed and thus light transmittance for an electronic element may be secured. In the case where the display device 1 includes the display panel 10 shown in FIGS. 2B and 2C, it may be appropriate to use an electronic element that uses light as the electronic element.

FIGS. 2A to 2C describe the component 20 located under the display panel 10. In another embodiment, the component 20 may be located inside the through hole 10H to overlap lateral surfaces of the display panel 10 that define the through hole 10H.

The component 20 may be another member other than the above-described electronic element. For example, in the case where the display panel 10 is used as a smart watch or an instrument panel for an automobile, the component 20 may be a member including a needle of a clock or a needle indicating predetermined information (e.g. velocity of a vehicle, etc.). Alternatively, the component 20 may include an element such as an accessory that increases an esthetic sense of the display panel 10.

Figure 3A:
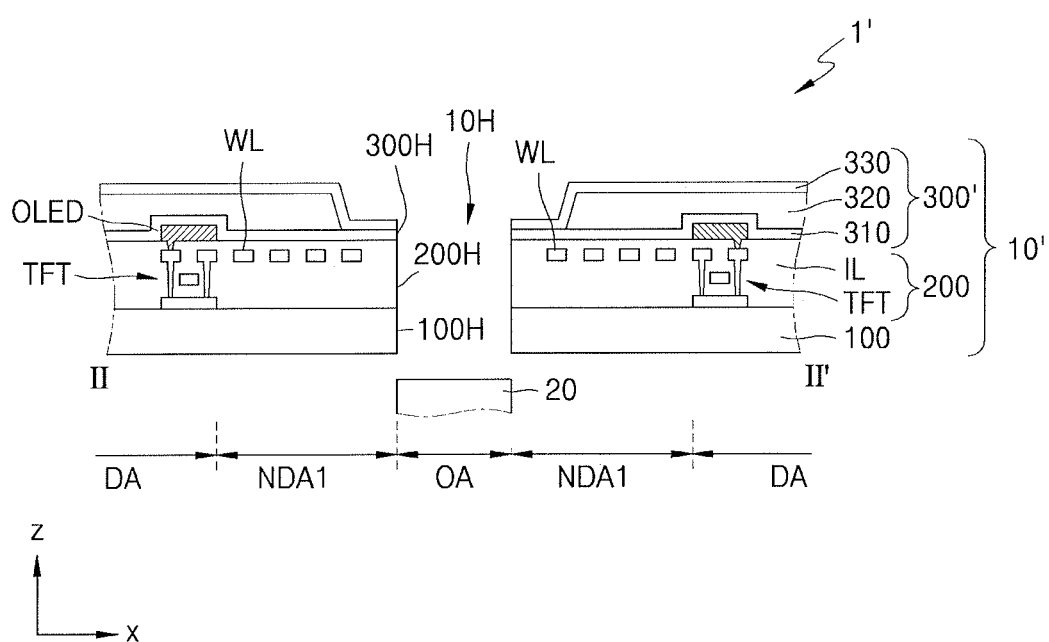
FIGS. 3A to 3C illustrate cross-sectional views of a display device according to another embodiment.
Figure 3B:
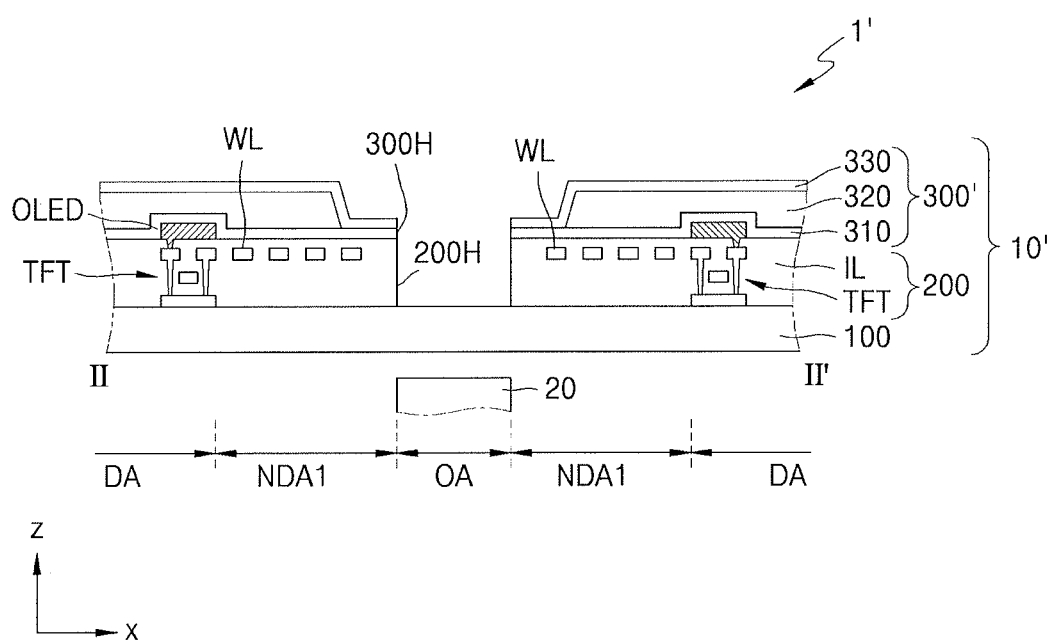
Figure 3C:
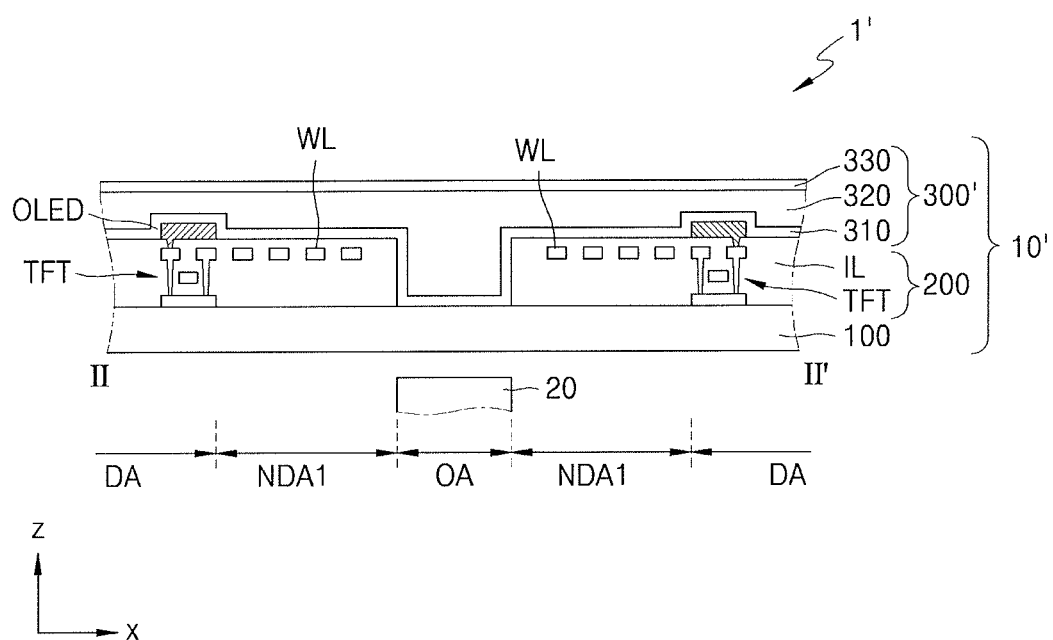

FIGS. 3A to 3C are cross-sectional views of a display device 1' according to another embodiment. FIGS. 3A to 3C correspond to a cross-section taken along line II-II' of FIG. 1.

Referring to FIG. 3A, the display device 1' may include a display panel 10' and the component 20. Also, the display device 1' may further include an input detector configured to detect a touch input, a reflection prevention member, and a window arranged over the display panel 10'.

The display panel 10' according to the present embodiment may include a thin film encapsulation layer 300' as an encapsulation member. For example, the thin film encapsulation layer 300' of the display panel 10' may be thinner and more flexible than the encapsulation substrate 300 of the display panel 10 in FIGS. 2A-2C. In this case, flexibility of the display panel 10' is improved even more. For convenience of description, differences are mainly described below.

The thin film encapsulation layer 300' may include at least one inorganic encapsulation layer and at least one organic encapsulation layer. With regard to this, FIG. 3A illustrates first and second inorganic encapsulation layers 310 and 330, and an organic encapsulation layer 320 therebetween.

The first and second inorganic encapsulation layers 310 and 330 may include one or more inorganic insulating materials among, e.g., aluminum oxide, titanium oxide, tantalum oxide, hafnium oxide, zinc oxide, silicon oxide, silicon nitride, and silicon oxynitride. The organic encapsulation layer 320 may include a polymer-based material, e.g., an acrylic-based resin, an epoxy-based resin, PI, and polyethylene.

The display panel 10' may include the through hole 10H corresponding to the opening area OA. For example, the substrate 100 and the thin film encapsulation layer 300' may respectively include through holes 100H and 300H. The first and second inorganic encapsulation layers 310 and 330 and the organic encapsulation layer 320 may respectively include holes corresponding to, e.g., overlapping, the opening area OA. A size of the hole of the organic encapsulation layer 320 may be greater than sizes of the holes of the first and second inorganic encapsulation layers 310 and 330. Therefore, the first and second inorganic encapsulation layers 310 and 330 may contact each other around the opening area OA. For example, as illustrated in FIG. 3A, the organic encapsulation layer 320 may be, e.g., completely, enclosed between the first and second inorganic encapsulation layers 310 and 330, so edges of the first and second inorganic encapsulation layers 310 and 330 may contact each other and extend together, e.g., in parallel to the substrate 100, toward the opening area OA. For example, as illustrated in FIG. 3A, lateral surfaces of the first and second inorganic encapsulation layers 310 and 330, the substrate 100, and the insulating layer IL in the display element layer 200 may be level with each other to define a sidewall of the through hole 10H.

Unlike FIG. 3A in which the display panel 10 includes the through hole 10H corresponding to the opening area OA, the display panel 10 may not include the through hole 10H. For example, as illustrated in FIG. 3B, though the thin film encapsulation layer 300' includes the through hole 300H corresponding to the opening area OA, the substrate 100 may not include the through hole 100H. In another example, as illustrated in FIG. 3C, both the substrate 100 and the thin film encapsulation layer 300' may not include through holes corresponding to the opening area OA. As illustrated in FIGS. 3B and 3C, even though the substrate 100 does not include the through hole 100H, portions of the display element layer 200 corresponding to the opening area OA are removed and thus light transmittance for an electronic element may be secured as described above.

In the case where the thin film encapsulation layer 300' does not include the through hole, as illustrated in FIG. 3C, each of at least one inorganic encapsulation layer and at least one organic encapsulation layer may cover the substrate 100 in the opening area OA. In this case, a portion of the display element layer 200 between the substrate 100 and the thin film encapsulation layer 300' corresponding to the opening area OA may be removed. Though FIG. 3A illustrates that a portion of the insulating layer IL corresponding to the opening area OA is entirely removed, only some sub-layers of the insulating layer IL, which is a multi-layer, may be removed.

FIGS. 3A to 3C illustrate the component 20 under the display panel 10. In another embodiment, for example, the component 20 may be located inside the through hole 10H, e.g., extend inside the through hole 100H of the substrate 100, the through hole 200H of the display element layer 200, and the through hole 300H of the thin film encapsulation layer 300'. In another example, the component 20 may located over the substrate 100 and inside the through hole 200H of the display element layer 200 of FIG. 3B.

Figure 4:
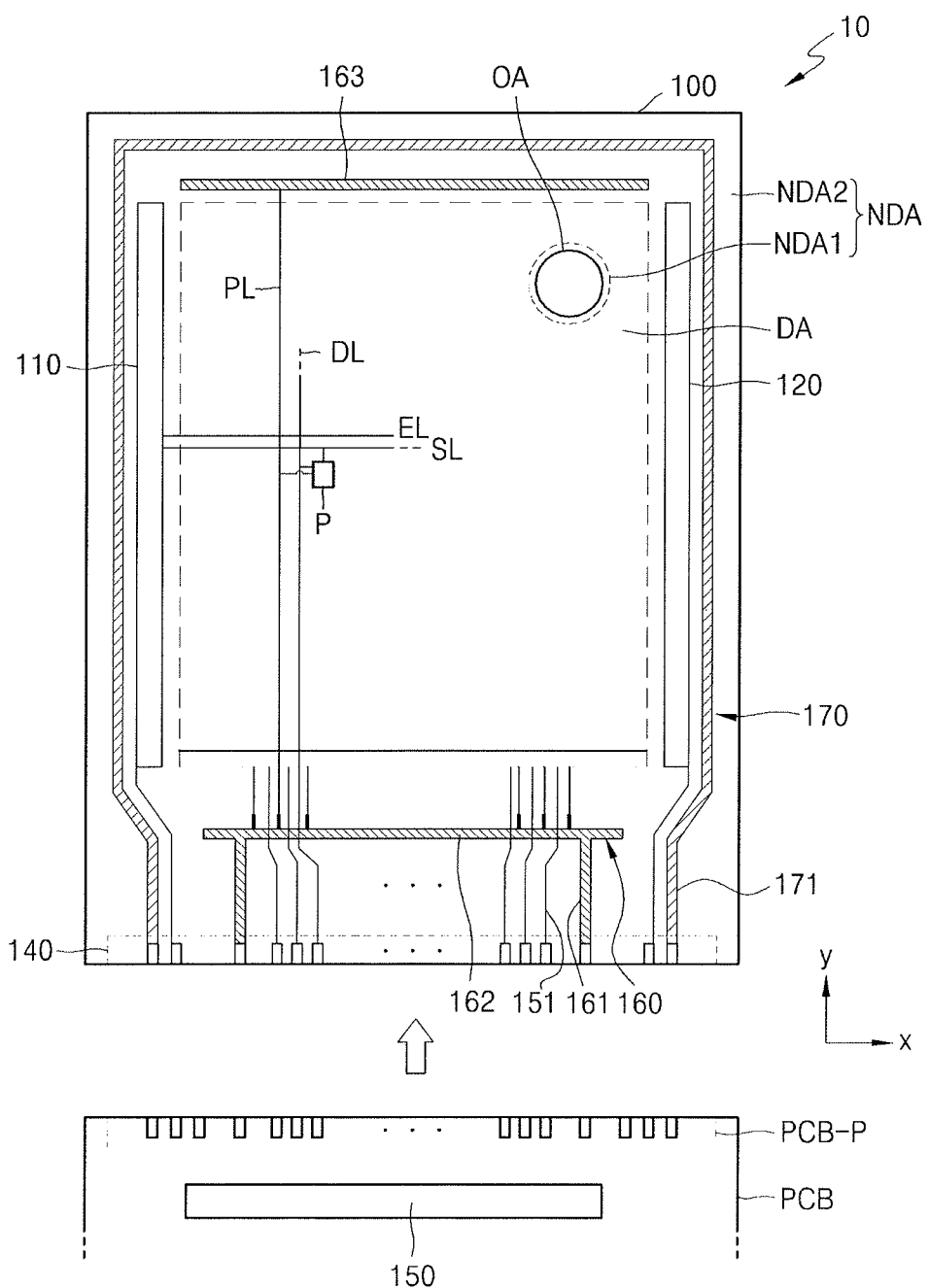
FIG. 4 illustrates a plan view of a display panel according to an embodiment.

FIG. 4 is a plan view of the display panel 10 according to an embodiment.

Referring to FIG. 4, the display panel 10 includes a plurality of pixels P arranged in the display area DA. Each of the pixels P may include a display element such as an organic light-emitting diode. Each pixel P may emit, e.g., red, green, blue or white, light through the organic light-emitting diode. In the present specification, a pixel P may be understood as a pixel that emits light of one of red, green, blue and white colors as described above. The display area DA may be protected from external air or moisture by being covered by the encapsulation member described with reference to FIGS. 2A to 3C.

The opening area OA may be arranged inside the display area DA (e.g., the display area DA is indicated as a dashed quadrangle in FIG. 4), and the plurality of pixels P may be arranged around the opening area OA. The plurality of pixels P may surround the opening area OA, and the first non-display area NDA1, in which pixels P are not arranged, is located between the opening area OA and the display area DA, e.g., the first non-display area NDA1 may be positioned between the opening area OA and the plurality of pixels P in the display area DA. Wirings configured to apply a predetermined signal or power to the plurality of pixels P spaced around the opening area OA may bypass, e.g., be positioned completely outside, the opening area OA. A structure that allows the bypass of the wirings will be described below with reference to FIG. 7.

Each pixel P is electrically connected with outer circuits arranged in the non-display area NDA, e.g., in the second non-display area NDA2 (e.g., the second non-display area NDA2 is indicated as the area between the dashed quadrangle and the outer solid line in FIG. 4). A first scan driving circuit 110, a second scan driving circuit 120, a terminal 140, a data driving circuit 150, a first power supply line 160, and a second power supply line 170 may be arranged in the second non-display area NDA2.

The first scan driving circuit 110 may provide a scan signal to each pixel P through a scan line SL. The first scan driving circuit 110 may provide an emission control signal to each pixel P through an emission control line EL. The second scan driving circuit 120 may be arranged with the first scan driving circuit 110 side by side with the display area DA therebetween. Some pixels P arranged in the display area DA may be electrically connected with the first scan driving circuit 110, and the other pixels P may be electrically connected with the second scan driving circuit 120. In another embodiment, the second scan driving circuit 120 may be omitted.

The terminal 140 may be arranged on one side of the substrate 100. The terminal 140 may not be covered by an insulating layer, but may be exposed and electrically connected with a printed circuit board PCB. A terminal PCB-P of the printed circuit board PCB may be electrically connected with the terminal 140 of the display panel 10. The printed circuit board PCB transfers a signal of a controller or power to the display panel 10. Control signals generated by the controller may be respectively transferred to the first and second scan driving circuits 110 and 120 through the printed circuit board PCB. The controller may respectively provide first and second powers ELVDD and ELVSS to the first and second power supply lines 160 and 170 through first and second connection wirings 161 and 171 (refer to FIG. 5 below). The first power ELVDD may be provided to each pixel P through a driving voltage line PL connected with the first power supply line 160, and the second power ELVSS may be provided to an opposite electrode of a pixel P connected with the second power supply line 170.

The data driving circuit 150 is electrically connected with a data line DL. A data signal of the data driving circuit 150 may be provided to each pixel P through a connection wiring 151 connected with the terminal 140 and the data line DL connected with the connection wiring 151. Though FIG. 4 illustrates the data driving circuit 150 is arranged in the printed circuit board PCB, the data driving circuit 150 may be arranged over the substrate 100 in another embodiment. For example, the data driving circuit 150 may be arranged between the terminal 140 and the first power supply line 160.

The first power supply line 160 may include a first sub-line 162 and a second sub-line 163 extending side by side in an x-direction with the display area DA therebetween in the y-direction. The first power supply line 160 may be electrically connected to the terminal 140 via the first connection wiring 161 that extends from the first sub-line 162. The second power supply line 170 has a loop shape with one side open and may partially surround the display area DA. The second power supply line 170 may be electrically connected to the terminal 140 via the second connection wiring 171.

Figure 5:
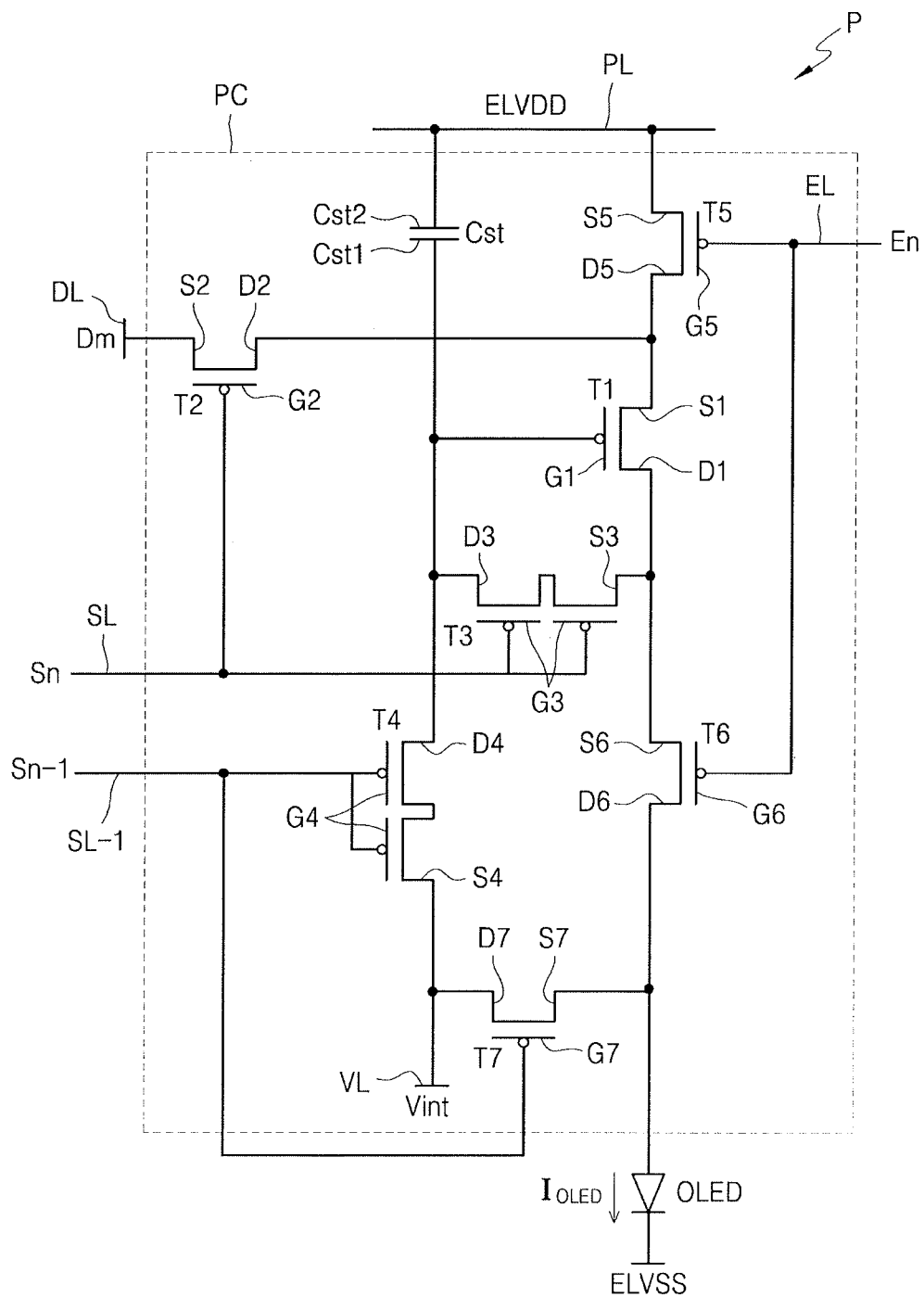
FIG. 5 illustrates an equivalent circuit diagram of one pixel in a display panel according to an embodiment.

FIG. 5 is an equivalent circuit diagram of one pixel P in the display panel 10 according to an embodiment.

Referring to FIG. 5, the pixel P includes a pixel circuit PC and an OLED connected to the pixel circuit PC. The pixel circuit PC may include a plurality of thin film transistors and a storage capacitor Cst. The thin film transistors and the storage capacitor may be connected to signal lines SL, SL−1, EL and DL, an initialization voltage line VL, and a driving voltage line PL.

Though FIG. 5 illustrates that each pixel P is connected to the signal lines SL, SL−1, EL and DL, the initialization voltage line VL, and the driving voltage line PL, the embodiment is not limited thereto. In another embodiment, at least one of the signal lines SL, SL−1, EL and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line SL configured to transfer a scan signal Sn, the previous scan line SL−1 configured to transfer a previous scan signal Sn−1 to the first initialization thin film transistor T4 and the second initialization thin film transistor T7, an emission control line EL configured to transfer an emission control signal En to the operation control thin film transistor T5 and the emission control thin film transistor T6, and the data line DL crossing the scan line SL and configured to transfer a data signal Dm. The driving voltage line PL transfers the driving voltage ELVDD to the driving thin film transistor T1, and the initialization voltage line VL transfers an initialization voltage Vint that initializes the driving thin film transistor T1 and a pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected with the pixel electrode of an OLED through the emission control thin film transistor T6. The driving thin film transistor T1 receives a data signal Dm and supplies a driving current $I_{OLED}$ to the OLED in response to a switching operation of the switching thin film transistor T2.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and connected to the pixel electrode of the OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 with the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation of initializing a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the OLED.

The operation control thin film transistor T5 and the emission control thin film transistor T6 are simultaneously turned on in response to an emission control signal En transferred through the emission control line EL to allow the driving voltage ELVDD to be transferred to the OLED and allow the driving current $I_{OLED}$ to flow through the OLED.

A second initialization gate electrode G7 of the second initialization thin film transistor T7 is connected to the previous scan line SL−1, a second initialization source electrode S7 of the second initialization thin film transistor T7 is connected to the emission control drain electrode D6 of the emission control thin film transistor T6 and the pixel electrode of the OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn−1 transferred through the previous scan line SL−1 to initialize the pixel electrode of the OLED.

Though FIG. 5 illustrates that the first initialization thin film transistor T4 and the second initialization thin film transistor T7 are connected to the previous scan line SL−1, the embodiment is not limited thereto. In another embodiment, the first initialization thin film transistor T4 may be connected to the previous scan line SL−1 and driven in response to a previous scan signal Sn−1, and the second initialization thin film transistor T7 may be connected to a separate signal line (e.g. the next scan line) and driven in response to a signal transferred through the signal line.

A second storage capacitor plate Cst2 of the storage capacitor Cst is connected to the driving voltage line PL, and the opposite electrode of the OLED is connected to a common voltage ELVSS. Accordingly, the OLED may display an image by receiving the driving current $I_{OLED}$ from the driving thin film transistor T1 and emitting light.

Though FIG. 5 illustrates that each of the compensation thin film transistor T3 and the first initialization thin film transistor T4 includes a dual gate electrode, each of the compensation thin film transistor T3 and the first initialization thin film transistor T4 may include one gate electrode.

Figure 6A:
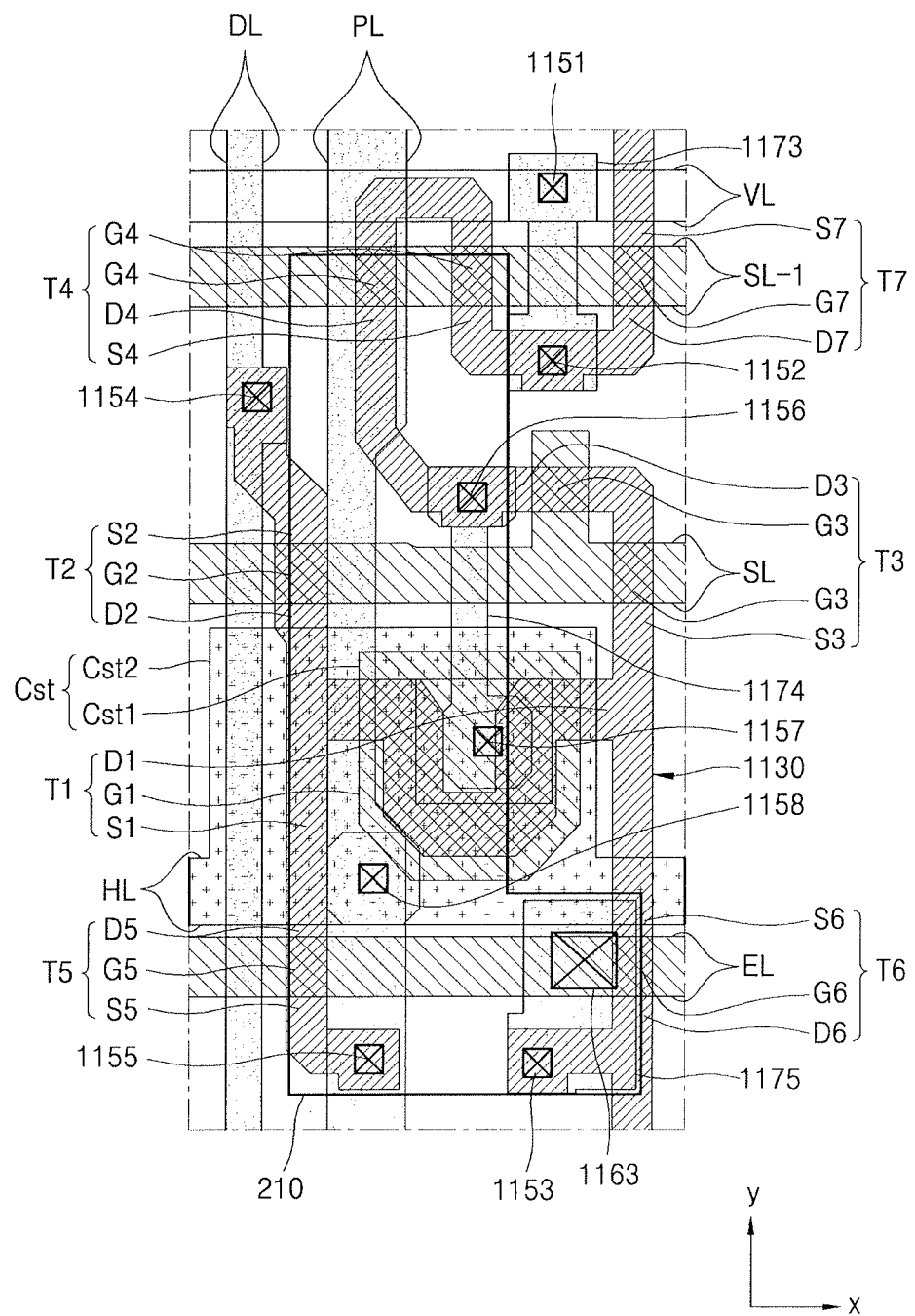
FIG. 6A illustrates a plan view of a pixel circuit of one pixel in a display panel according to an embodiment.

FIG. 6A is a plan view of the pixel circuit of the pixel p in the display panel 10 according to an embodiment.

Referring to FIG. 6A, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. The semiconductor layer 1130 is arranged over a substrate on which a buffer layer including an inorganic insulating material is arranged.

Some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, it may be understood that semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to each other and bent in various shapes.

The semiconductor layer 1130 includes a channel region, a source region and a drain region in two opposite sides of the channel region. The source region and the drain region may be understood as a source electrode and a drain electrode of the relevant thin film transistor. Hereinafter, for convenience of description, the source region and the drain region are respectively called a source electrode and a drain electrode.

The driving thin film transistor T1 includes the driving gate electrode G1 that overlaps a driving channel region, and the driving source electrode S1 and the driving drain electrode D1 in two opposite sides of the driving channel region. The driving channel region that overlaps the driving gate electrode G1 may form a long channel length inside a narrow space by having a bent shape such as an omega shape. In the case where the length of the driving channel region is long, since a driving range of a gate voltage is widened, a gray scale of light emitted from the OLED may be more elaborately controlled and display quality may be improved.

The switching thin film transistor T2 includes the switching gate electrode G2 that overlaps a switching channel region, and the switching source electrode S2 and the switching drain electrode D2 in two opposite sides of the switching channel region. The switching drain electrode D2 may be connected with the driving source electrode S1.

The compensation thin film transistor T3 is a dual thin film transistor and may include compensation gate electrodes G3 that respectively overlap two compensation channel regions, and include the compensation source electrode S3 and the compensation drain electrode D3 arranged in two opposite sides of the compensation channel region. The compensation thin film transistor T3 may be connected to the driving gate electrode G1 of the driving thin film transistor T1 through a node connection line 1174 described below.

The first initialization thin film transistor T4 is a dual thin film transistor and may include first initialization gate electrodes G4 that respectively overlap two first initialization channel regions, and include the first initialization source electrode S4 and the first initialization drain electrode D4 arranged in two opposite sides of the first initialization channel region.

The operation control thin film transistor T5 may include the operation control gate electrode G5 that overlaps an operation control channel region, and the operation control source electrode S5 and the operation control drain electrode D5 arranged in two opposite sides of the operation control channel region. The operation control drain electrode D5 may be connected to the driving source electrode S1.

The emission control thin film transistor T6 may include the emission control gate electrode G6 that overlaps an emission control channel region, the emission control source electrode S6 and the emission control drain electrode D6 arranged in two opposite sides of the emission control channel region. The emission control source electrode S6 may be connected to the driving drain electrode D1.

The second initialization thin film transistor T7 may include the second initialization gate electrode G7 that overlaps a second initialization channel region, and the second initialization source electrode S7 and the second initialization drain electrode D7 arranged in two opposite sides of the second initialization channel region.

The above-described thin film transistors may be connected to the signal lines SL, SL−1, EL, and DL, the initialization voltage line VL, and the driving voltage line PL.

The scan line SL, the previous scan line SL−1, the emission control line EL, and the driving gate electrode G1 may be arranged over the semiconductor layer 1130 with an insulating layer(s) therebetween.

The scan line SL may extend in the x-direction. Some regions of the scan line SL may correspond to the switching and compensation gate electrodes G2 and G3. For example, regions of the scan line SL that overlap the channel regions respectively of the switching and compensation thin film transistors T2 and T3 may be the switching and compensation gate electrodes G2 and G3.

The previous scan line SL−1 may extend in the x-direction and some regions of the previous scan line SL−1 may correspond to the first and second initialization gate electrodes G4 and G7. For example, regions of the previous scan line SL−1 that overlap the channel regions of the first and second initialization thin film transistors T4 and T7 may be the first and second initialization gate electrodes G4 and G7, respectively.

The emission control line EL may extend in the x-direction. Some regions of the emission control line EL may correspond to the operation control and emission control gate electrodes G5 and G6. For example, regions of the emission control line EL that overlap the channel regions of the operation control and the emission control thin film transistors T6 and T7 may be the operation control and emission control gate electrodes G5 and G6, respectively.

The driving gate electrode G1 is a floating electrode and may be electrically connected with the compensation thin film transistor T3 through the above-described node connection line 1174.

An electrode voltage line HL may be arranged over the scan line SL, the previous scan line SL−1, the emission control line EL, and the driving gate electrode G1 with an insulating layer(s) therebetween.

The electrode voltage line HL may extend in the x-direction to cross the data line DL and the driving voltage line PL. A portion of the electrode voltage line HL may cover at least a portion of the driving gate electrode G1 and form the storage capacitor Cst with the driving gate electrode G1. For example, the driving gate electrode G1 may serve as the first storage capacitor plate Cst1 of the storage capacitor Cst, and a portion of the electrode voltage line HL may serve as the second storage capacitor plate Cst2 of the storage capacitor Cst.

The second storage capacitor plate Cst2 of the storage capacitor Cst is electrically connected to the driving voltage line PL. With regard to this, the electrode voltage line HL may be connected to the driving voltage line PL arranged over the electrode voltage line HL through a contact hole 1158. Therefore, the electrode voltage line HL may have the same voltage level (constant voltage) as the driving voltage line PL. For example, the electrode voltage line HL may have a constant voltage of +5V. The electrode voltage line HL may be understood as a transverse driving voltage line.

Since the driving voltage line PL extends in a y-direction and the electrode voltage line HL electrically connected to the driving voltage line PL extends in the x-direction that crosses the y-direction, a plurality of driving voltage lines PL and the electrode voltage lines HL may constitute a mesh structure in the display area DA.

The data line DL, the driving voltage line PL, an initialization connection line 1173 and the node connection line 1174 may be arranged over the electrode voltage line HL with an insulating layer(s) therebetween.

The data line DL may extend in the y-direction and may be connected to the switching source electrode S2 of the switching thin film transistor T2 through a contact hole 1154. A portion of the data line DL may be understood as the switching source electrode S2.

The driving voltage line PL extends in the y-direction and is connected to the electrode voltage line HL through the contact hole 1158 as described above. Also, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and another end of the initialization connection line 1173 may be connected to the initialization voltage line VL, which will be described below, through a contact hole 1151.

One end of the node connection line 1174 may be connected to the compensation drain electrode D3 through a contact hole 1156, and another end of the node connection line 1174 may be connected to the driving gate electrode G1 through a contact hole 1157.

The initialization voltage line VL may be arranged over the data line DL, the driving voltage line PL, the initialization connection line 1173, and the node connection line 1174 with an insulating layer(s) therebetween.

The initialization voltage line VL extends in the x-direction. The initialization voltage line VL may be connected to the first and second initialization thin film transistors T4 and T7 through the initialization connection line 1173. The initialization voltage line VL may have a constant voltage (e.g. −2V).

The initialization voltage line VL may be arranged in the same layer in which a pixel electrode 210 of the OLED (see FIG. 5) is arranged, and may include the same material as the pixel electrode 210. The pixel electrode 210 may be connected to the emission control thin film transistor T6. The pixel electrode 210 may be connected to a connection metal 1175 through a contact hole 1163, and the connection metal 1175 may be connected to the emission control drain electrode D6 through a contact hole 1153.

Though FIG. 6A illustrates that the initialization voltage line VL is arranged in the same layer as the pixel electrode 210, the initialization voltage line VL may be arranged in the same layer as the electrode voltage line HL.

Figure 6B:
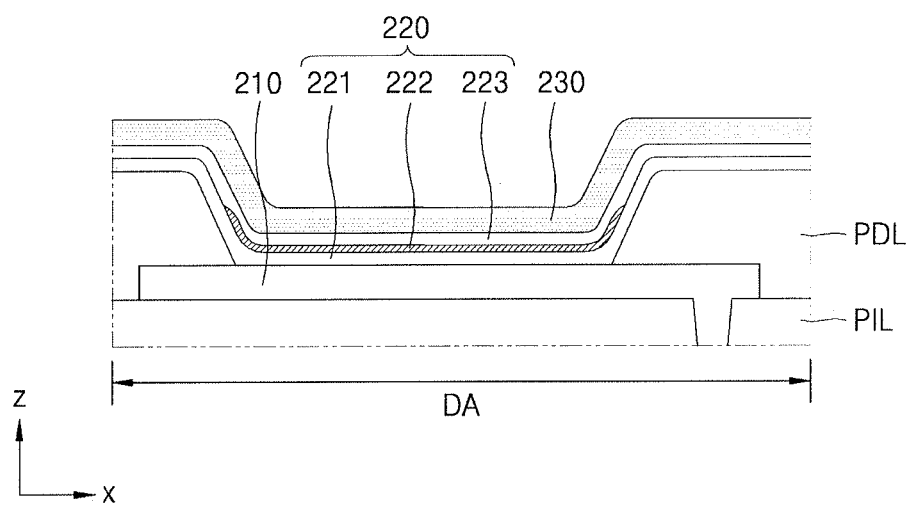
FIG. 6B illustrates a cross-sectional view of a display element over the pixel circuit of FIG. 6A.

Referring to FIG. 6B, the pixel electrode 210 is arranged on a planarization insulating layer PIL that covers the above-described pixel circuit PC. An end of the pixel electrode 210 is covered by a pixel-defining layer PDL.

An intermediate layer 220 is arranged on a portion of the pixel electrode 210 exposed through an opening of the pixel-defining layer PDL and includes an emission layer 222. The emission layer 222 may include a polymer or low molecular organic material that emits light of a predetermined color. In an embodiment, the intermediate layer 220 may include a first functional layer 221 arranged under the emission layer 222 and/or a second functional layer 223 arranged on the emission layer 222 as illustrated in FIG. 6B.

The first functional layer 221 may be a single layer or a multi-layer. For example, in the case where the first functional layer 221 includes a polymer material, the first functional layer 221 is a hole transport layer (HTL) of a single structure and may include poly-(3,4)-ethylene-dihydroxy thiophene (PEDOT) or polyaniline (PANT). In the case where the first functional layer 221 includes a low molecular material, the first functional layer 221 may include a hole injection layer (HIL) and an HTL.

The second functional layer 223 is not necessarily provided. For example, in the case where the first functional layer 221 and the emission layer 222 include a polymer material, it is preferable to form the second functional layer 223 so as to make a characteristic of the OLED excellent. The second functional layer 223 may be a single layer or a multi-layer. The second functional layer 223 may include an electron transport layer (ETL) and/or an electron injection layer (EIL).

The opposite electrode 230 faces the pixel electrode 210 with the intermediate layer 220 therebetween. The opposite electrode 230 may include a conductive material having a low work function. For example, the opposite electrode 230 may include a (semi) transparent layer including one of Ag, Mg, Al, Pt, Pd, Au, Ni, Nd, Ir, Cr, Li, Ca, and an alloy thereof. Alternatively, the opposite electrode 230 may further include a layer including a material such as ITO, IZO, ZnO, or $In_2O_3$ over the (semi) transparent layer including the above-described material.

Though FIGS. 5 and 6A illustrate that the pixel circuit PC includes the seven thin film transistors and one storage capacitor, the embodiment is not limited thereto. The numbers of thin film transistors and storage capacitors may change variously depending on a design of the pixel circuit PC.

Figure 7:
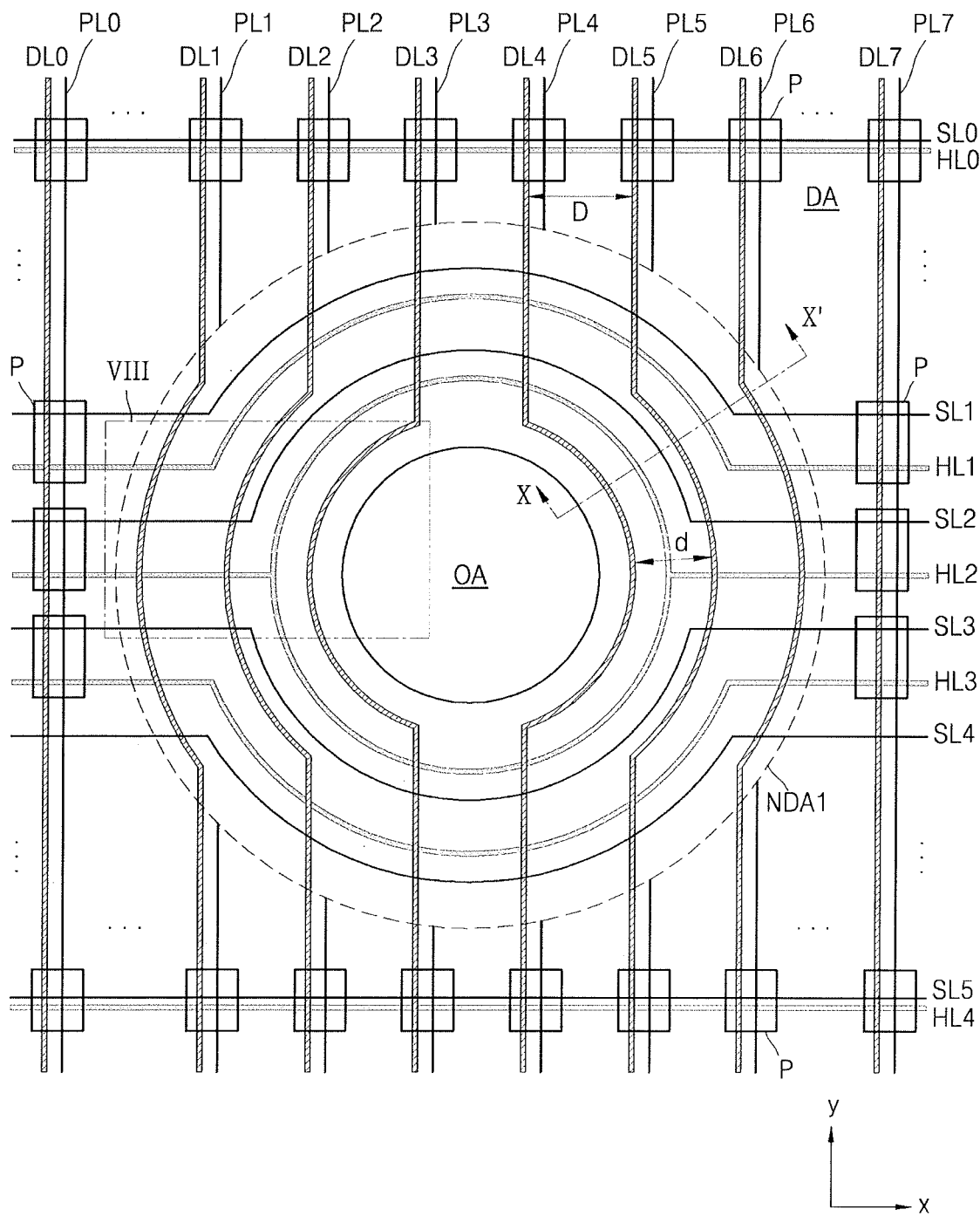
FIG. 7 illustrates a plan view of wirings around an opening area according to an embodiment.
Figure 8:
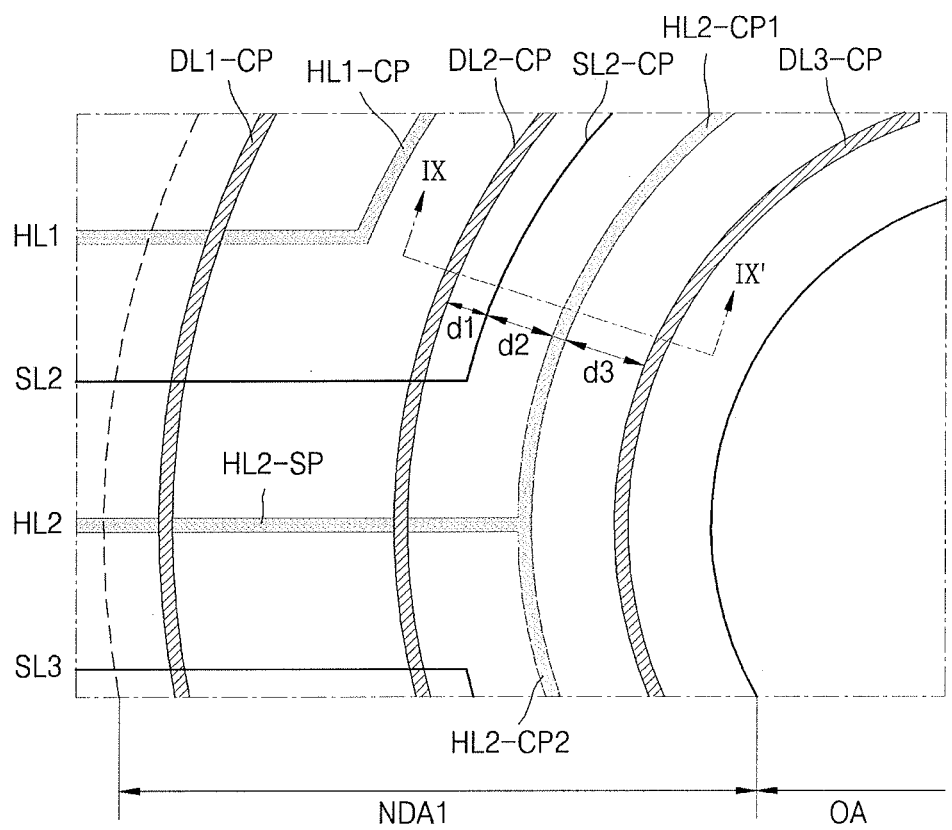
FIG. 8 illustrates an enlarged plan view of portion VIII of FIG. 7.
Figure 9A:
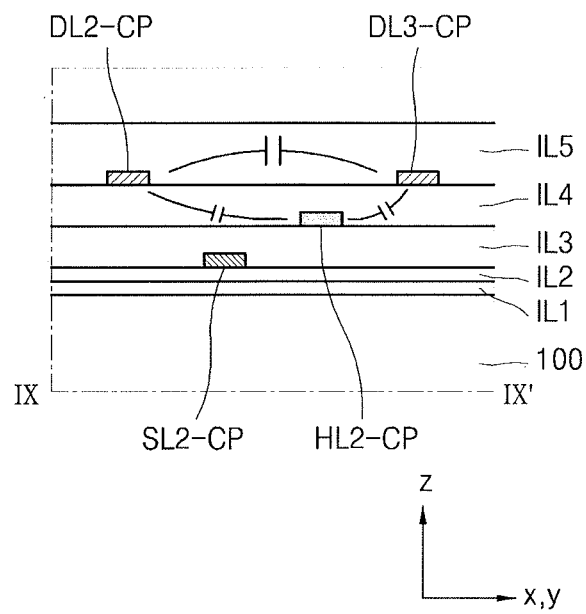
FIGS. 9A and 9B illustrate cross-sectional views of a wiring taken along line IX-IX' of FIG. 8.
Figure 9B:
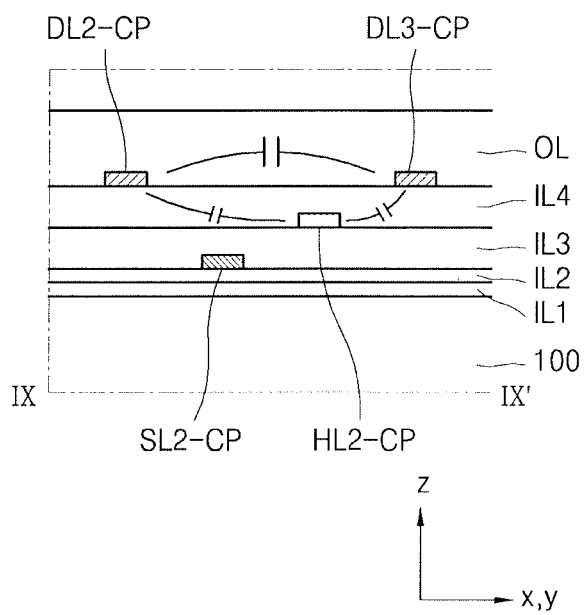

FIG. 7 is a plan view of wirings around the opening area OA according to an embodiment, FIG. 8 is an enlarged plan view of portion VIII of FIG. 7, and FIGS. 9A and 9B are cross-sectional views of a wiring taken along line IX-IX' of FIG. 8.

Referring to FIG. 7, data lines DL0 to DL7 may extend in the y-direction, and driving voltage lines PL0 to PL7 may extend in the y-direction. The driving voltage lines PL0 and PL7 among the driving voltage lines PL0 to PL7 may continuously extend to pass across the display area DA, but the driving voltage lines PL1 to PL6 around the opening area OA may be cut around the opening area OA. Portions of the cut driving voltage lines PL1 to PL6 that correspond to an upper portion of the opening area OA may be connected to the second sub-line 163 described with reference to FIG. 4, and portions of the cut driving voltage lines PL1 to PL6 that correspond to a lower portion of the opening area OA may be connected to the first sub-line 162.

The data lines DL1 to DL6 may bypass around the opening area OA. For example, each of the data lines DL1 to DL6 may include a first portion that extends in the y-direction and a second portion that detours, e.g., curves, along an edge of the opening area OA. For example, as illustrated in FIG. 7, the first portion may be linear and include two parts on opposite sides of the opening area OA, and the second portion may be a circuitous, e.g., curved, portion connecting the two parts of the linear portion. The circuitous, e.g., curved, portion of each of the data lines DL1 to DL6 may be located in the first non-display area NDA1, e.g., completely outside of the opening area OA. For example, as illustrated in FIG. 7, the circuitous portion of each of the data lines DL1 to DL6 in the first non-display area NDA1 may curve around, e.g., trace a shape of, the opening area OA to connect two corresponding linear portions of the respective data line of the data lines DL1 to DL6.

Pixels P located above and below the opening area OA may be electrically connected to the data lines DL1 to DL6 that bypass the opening area OA and may receive signals from the relevant data lines DL1 to DL6. The first to third data lines DL1, DL2, and DL3 among the data lines DL1 to DL6 may be curved along the left edge of the opening area OA, and the fourth to sixth data lines DL4, DL5, and DL6 may be curved along the right edge of the opening area OA, as illustrated in FIG. 7.

The scan lines SL0 to SL5 may extend in the x-direction that crosses the data lines DL0 to DL7. The first to fourth scan lines SL1, SL2, SL3, and SL4 may bypass, e.g., bypass, around the opening area OA. For example, the first and second scan lines SL1 and SL2 may be curved along an upper edge of the opening area OA, and the third and fourth scan lines SL3 and SL4 may be curved along a lower edge of the opening area OA, as illustrated in FIG. 7. Each of the first to fourth scan lines SL1, SL2, SL3, and SL4 may include a portion that extends in the x-direction in the display area DA, and a portion that detours, e.g., bends, along an edge of the opening area OA in the first non-display area NDA1. Pixels P located at left and right sides of the opening area OA may be electrically connected to the first to fourth scan lines SL1, SL2, SL3, and SL4 that bypass the opening area OA.

The electrode voltage lines HL0 to HL4 may extend in the x-direction that crosses the data lines DL0 to DL7. The first to third electrode voltage lines HL1, HL2, and HL3 may bypass around the opening area OA. For example, the first electrode voltage line HL1 and the third electrode voltage line HL3 may include a portion that extends in the x-direction and a portion that bypasses, e.g., curves around, an upper side of the opening area OA. The second electrode voltage line HL2 may include a portion that extends in the x-direction and portions that respectively bypass the upper side and a lower side of the opening area OA. The circuitous portions of the second electrode voltage line HL2 may be connected to each other to form a ring shape.

In an embodiment, the number of data lines DL1 to DL7 that bypass the opening area OA may be greater than the number of scan lines SL1 to SL4 that bypass the opening area OA and/or the number of electrode voltage lines HL1 to HL3 that bypass the opening area OA. The number of data lines that bypass the opening area OA, the number of scan lines that bypass the opening area OA and/or the number of electrode voltage lines that bypass the opening area OA may be the same. In another embodiment, the number of data lines that bypass the first non-display area NDA1 may be less than the number of scan lines that bypass the opening area OA and/or the number of electrode voltage lines that bypass the opening area OA.

A circuitous portion (or a curved portion) of at least one of the electrode voltage lines HL1 to HL3 located in the first non-display area NDA1 may be located between circuitous portions (or curved portions) of adjacent (neighboring) data lines in the first non-display area NDA1.

For example, a circuitous portion HL1-CP of the first electrode voltage line HL1 may be located between circuitous portions DL1-CP and DL2-CP respectively of the first and second data lines DL1 and DL2 neighboring each other (see FIGS. 7 and 8). Also, the circuitous portion HL1-CP of the first electrode voltage line HL1 may be located between circuitous portions respectively of the fifth and six data lines DL5 and DL6 neighboring each other (see FIG. 7). Circuitous portions HL2-CP1 and HL2-CP2 of the second electrode voltage line HL2 may be located between circuitous portions DL2-CP and DL3-CP respectively of the second and third data lines DL2 and DL3 neighboring each other and may be connected to each other to form a ring shape (see FIGS. 7 and 8). Also, the circuit portions HL2-CP1 and HL2-CP2 of the second electrode voltage line HL2 may be located between circuitous portions respectively of the fourth and fifth data lines DL4 and DL5 neighboring each other (see FIG. 7). Likewise, circuitous portions of the third electrode voltage line HL3 may be located between the circuitous portions DL1-CP and DL2-CP respectively of the first and second data lines DL1 and DL2 neighboring each other, and the circuitous portions respectively of the fifth and six data lines DL5 and DL6 neighboring each other (see FIG. 7).

As illustrated in FIG. 7, a pitch between data lines neighboring each other in the non-display area NDA1, e.g., a first pitch d between curved portions of the data lines, is less than a second pitch D between the data lines neighboring each other in the display area DA. In this case, display quality of some pixels located in the display area DA could deteriorate due to a parasitic capacitance between the data lines neighboring each other arranged to have the first pitch d. However, in an embodiment, the occurrence of the parasitic capacitance may be reduced by the electrode voltage line HL of a constant voltage between the data lines neighboring each other.

Referring to FIG. 9A, coupling between the circuitous portions DL2-CP and DL3-CP respectively of the second and third data lines may be reduced by the circuitous portion HL2-CP of the second electrode voltage line. Since the electrode voltage line has a constant voltage, the coupling between the data lines neighboring each other may be more effectively reduced. Though FIG. 9A has described a relation between the second and third data lines and the second electrode voltage line, the relation is equally applicable to data lines neighboring each other in the first non-display area NDA1 and an electrode voltage line arranged therebetween.

The effect of reduction of the coupling by the electrode voltage line is applicable between scan lines neighboring each other in the first non-display area NDA1. Referring to FIG. 7 again, a circuitous portion of at least one of the electrode voltage lines HL1 to HL3 located in the first non-display area NDA1 may be located between circuitous portions (curved portions) of the scan lines SL1 to SL4 neighboring each other in the first non-display area NDA1. Each of the electrode voltage lines HL1 to HL3 having a constant voltage may reduce coupling between the scan lines SL1 to SL4 neighboring each other in the first non-display area NDA1.

Circuitous portions of the scan lines SL1 to SL4 may be arranged between the data lines DL1 to DL6 adjacent to (neighboring) each other in the first non-display area NDA1.

For example, the circuitous portion of the first scan line SL1 may be located between the circuitous portions respectively of the first and second data lines DL1 and DL2, and between the circuitous portions respectively of the fifth and sixth data lines DL5 and DL6 (see FIG. 7). A circuitous portion SL2-CP of the second scan line SL2 may be located between the circuitous portions of the second and third data lines DL2 and DL3 neighboring each other (see FIGS. 7 and 8). Also, the circuitous portion SL2-CP of the second scan line SL2 may be located between the circuitous portions of the fourth and sixth data lines DL4 and DL5 neighboring each other (see FIG. 7). A circuitous portion of the third scan line SL3 may be located between the circuitous portions respectively of the second and third data lines DL2 and DL3 neighboring each other, and the circuitous portions of the fourth and fifth data lines DL4 and DL5 (see FIG. 7). Likewise, a circuitous portion of the fourth scan line SL4 may be located between the circuitous portions respectively of the first and second data lines DL1 and DL2 and between the circuitous portions respectively of the fifth and sixth data lines DL5 and DL6 (see FIG. 7).

Each of the electrode voltage lines HL1 to HL3 and each of the scan lines SL1 to SL4 may be located between the data lines neighboring each other and spaced apart from each other as described above.

For example, the circuitous portion SL2-CP of the second scan line SL2 may be located between the circuitous portions DL2-CP and DL3-CP respectively of the second and third data lines DL2 and DL3 and spaced apart from a circuitous portion HL2-CP1 of the second electrode voltage line HL2. As illustrated in FIG. 8, the circuitous portion SL2-CP of the second scan line SL2 may be spaced apart from the circuitous portion DL2-CP of the second data line DL2 by a first distance d1, and the circuitous portion HL2-CP1 of the second electrode voltage line HL2 may be spaced apart from the circuitous portion SL2-CP of the second scan line SL2 by a second distance d2 and spaced apart from the circuitous portion DL3-CP of the third data line DL3 by a third distance d3. Though FIG. 3 has described a relation between the second scan line SL2 and the second electrode voltage line HL2, the relation is equally applicable to the other lines.

On a plane of FIG. 7, the data lines DL1 to DL6, the scan lines SL1 to SL4, and the electrode voltage lines HL1 to HL3 may be symmetric with respect to a virtual line passing through a center of the opening area OA.

Since the data lines DL1 to DL6 and the scan lines SL1 to SL4 that cross each other on a plane overlap each other in some sections but are arranged in different layers, an electric short circuit does not occur. Likewise, since the data lines DL1 to DL6 and the electrode voltage lines HL1 to HL3 that cross each other on a plane overlap each other in some sections but are arranged in different insulating layers, an electric short circuit does not occur.

As illustrated in FIG. 9A, first and second insulating layers IL1 and IL2 are arranged on the substrate 100, and a scan line, e.g., the circuitous portion SL2-CP of the second scan line SL2, may be arranged on the first and second insulating layers IL1 and IL2. The second scan line SL2 may be covered by a third insulating layer IL3, and an electrode voltage line, e.g., the circuitous portion HL2-CP of the second electrode voltage line HL2, may be arranged on the third insulating layer IL3. The second electrode voltage line HL2 may be covered by a fourth insulating layer IL4, and data lines, e.g., the circuitous portions DL2-CP and DL3-CP respectively of the second and third data lines DL2 and DL3, may be arranged on the fourth insulating layer IL4. The data lines may be covered by a fifth insulating layer IL5. The first to fifth insulating layers IL1, IL2, IL3, IL4, and IL5 may include an inorganic insulating material, e.g., silicon oxynitride or silicon nitride. In another embodiment, the data lines may be covered by an organic insulating layer OL including an organic insulating material, as illustrated in FIG. 9B. The organic insulating layer OL may be the planarization insulating layer described with reference to FIG. 6B. In another embodiment, though not shown, the data lines may be covered by the fifth insulating layer IL5 (see FIG. 9A) and an organic insulating layer OL on the fifth insulating layer IL5 (see FIG. 9A).

Figure 10A:
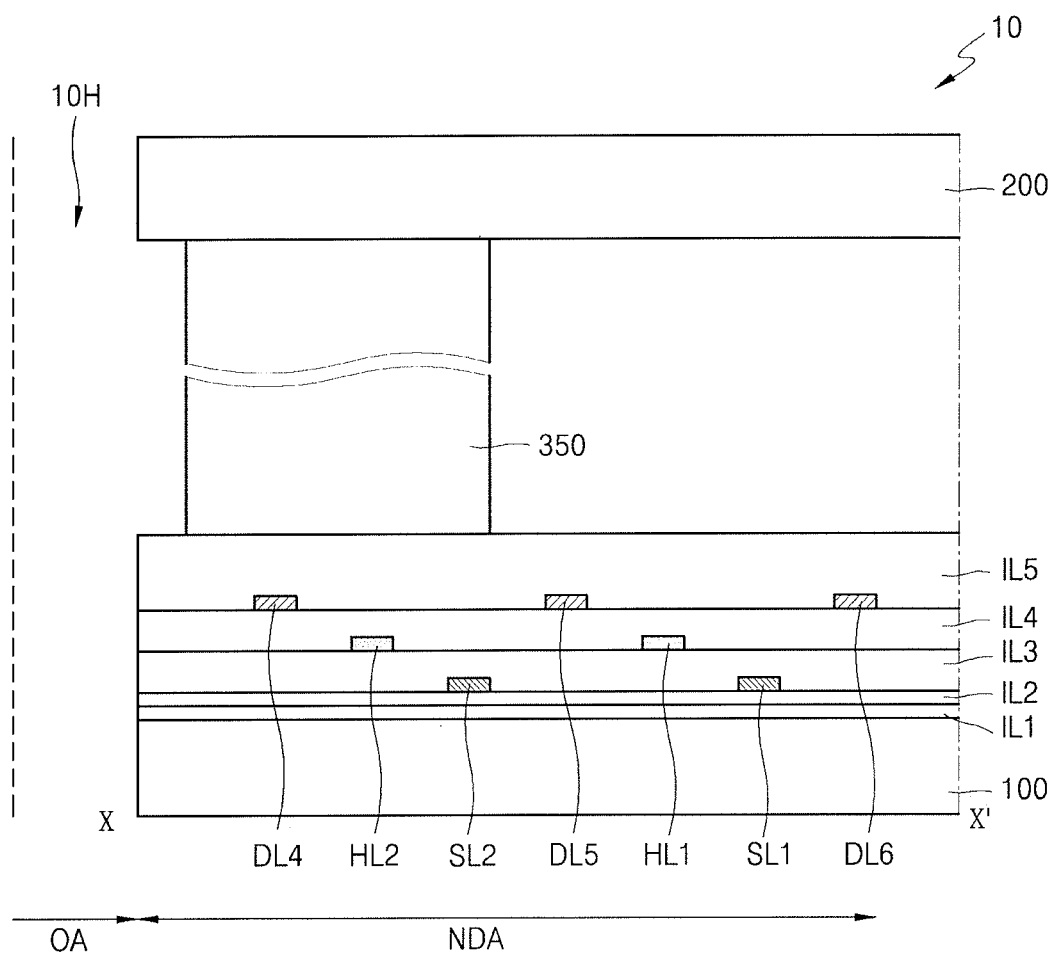
FIGS. 10A and 10B illustrate cross-sectional views of a display panel according to an embodiment along line X-X' of FIG. 7.
Figure 10B:
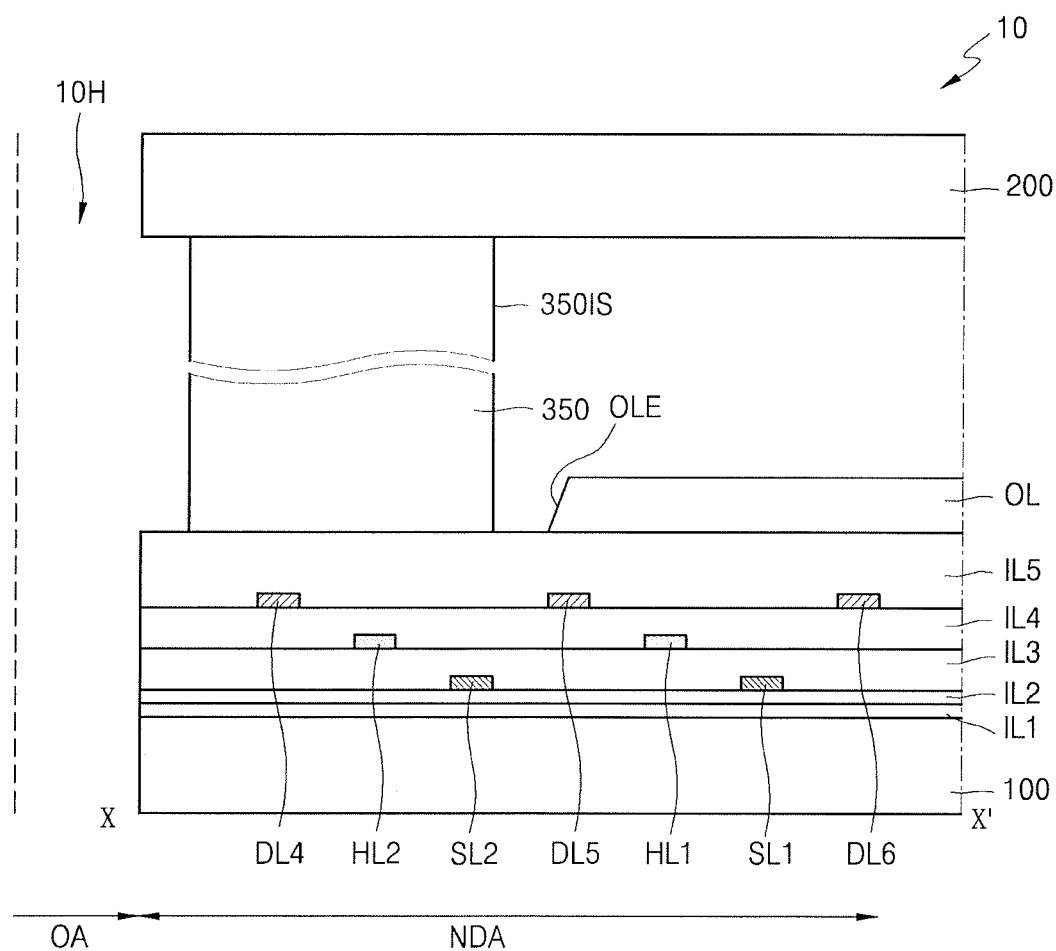

FIGS. 10A and 10B are cross-sectional views of a display panel according to an embodiment, taken along a line X-X' of FIG. 7.

Referring to FIG. 10A, the first to fifth insulating layers IL1, IL2, IL3, IL4, and IL5 that are sequentially stacked may be arranged on the substrate 100. Lateral surfaces of the first to fifth insulating layers IL1, IL2, IL3, IL4, and IL5 may form a lateral surface of a through hole 10H provided in the display panel 10. As a comparative example, in the case where an organic insulating material is exposed through the through hole 10H, since impurities, e.g., moisture, may penetrate through the organic insulating material, the first to fifth insulating layers ILL IL2, IL3, IL4, and IL5 include an inorganic insulating layer having low moisture transmission.

The scan line, the electrode voltage line, and the data line are arranged in different layers in the first non-display area NDA1. With regard to this, the first and second scan lines SL1 and SL2 are arranged over the second insulating layer IL2, the first and second electrode voltage lines HL1 and HL2 are arranged over the third insulating layer IL3, and the fourth to sixth data lines DL4, DL5, and DL6 are arranged over the fourth insulating layer IL4.

A sealing material 350 is arranged over the above-described wirings, for example, the scan line, the electrode voltage line, and the data line in the first non-display area NDA1. The sealing material 350 may overlap some of the above-described wirings and thus reduce an area of the first non-display area NDA1.

Though FIG. 10A illustrates that the wirings are covered by the fifth insulating layer IL5 which is an inorganic insulating layer, the embodiment is not limited thereto.

Referring to FIG. 10B, the wirings may be covered by an organic insulating layer OL. The organic insulating layer OL of FIG. 10B may be a planarization insulating layer PIL and/or the pixel-defining layer PDL described above with reference to FIG. 6B. To prevent moisture transmission in a lateral direction, an end OLE of the organic insulating layer OL may be located more inward than ends of the first to fourth insulating layers ILL IL2, IL3, and IL4. For example, the end OLE of the organic insulating layer OL may be located more inward (toward the display area DA) than an inner lateral wall 3501S of the sealing material 350.

Figure 11:
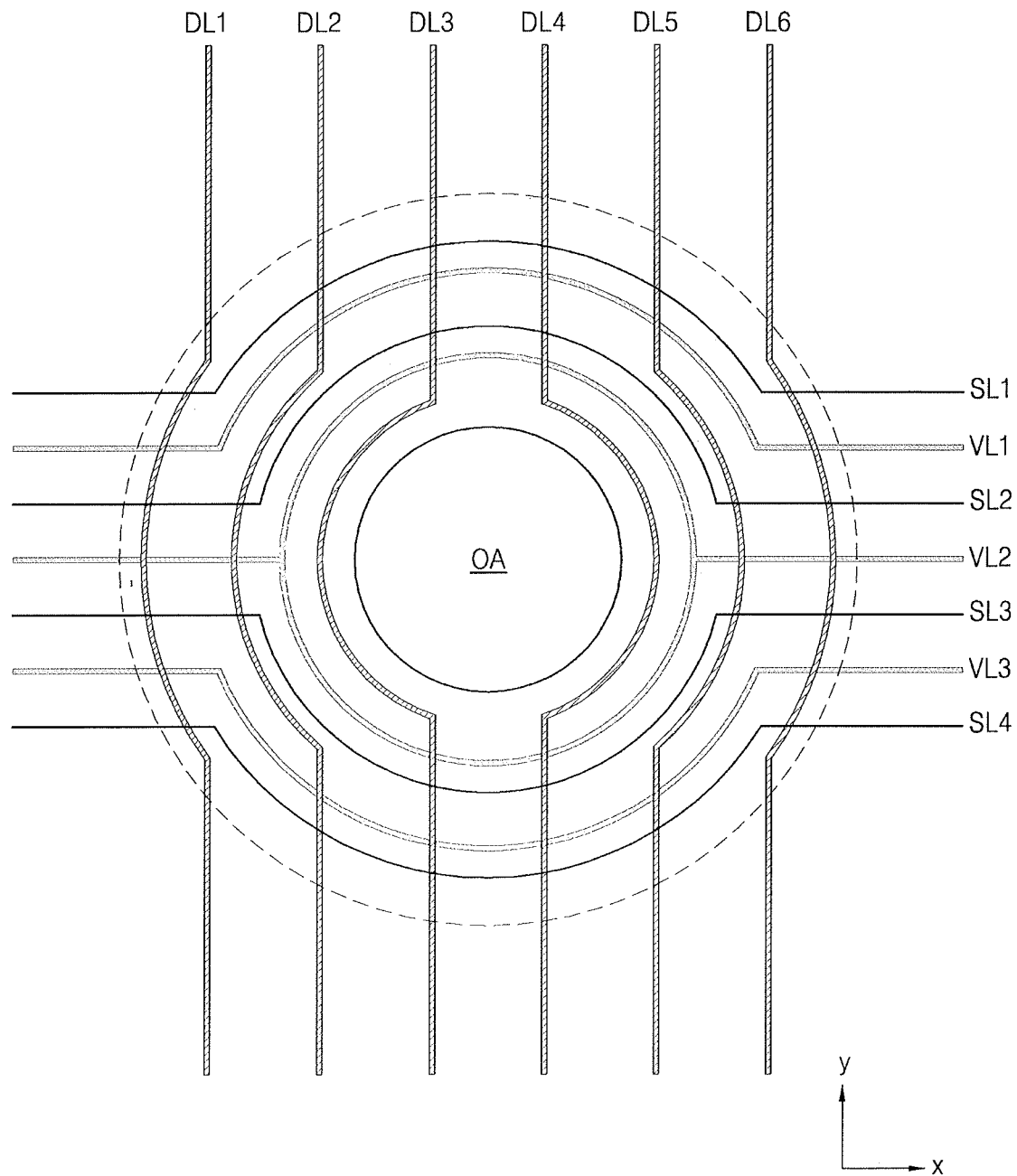
FIG. 11 illustrates a plan view of a display panel according to another embodiment.

FIG. 11 is a plan view of a display panel according to another embodiment.

Though the embodiment described with reference to FIGS. 7 and 8 has described that the electrode voltage lines HL1, HL2, and HL3 reduce the coupling between the data lines DL1, DL2, DL3, DL4, DL5, and DL6 neighboring each other in the first non-display area NDA1, or the coupling between the scan lines SL1, SL2, SL3, and SL4 neighboring each other in the first non-display area NDA1, FIG. 11 describes, as another embodiment, that initialization voltage lines VL1, VL2, and VL3 may reduce the coupling between the data lines DL1, DL2, DL3, DL4, DL5, and DL6 neighboring each other in the first non-display area NDA1, or the coupling between the scan lines SL1, SL2, SL3, and SL4 neighboring each other in the first non-display area NDA1.

Circuitous portions (or curved portions) respectively of the initialization voltage lines VL1, VL2, and VL3 may be located between the data lines DL1, DL2, DL3, DL4, DL5, and DL6 neighboring each other in the first non-display area NDA1, for example, between circuitous portions respectively of the data lines DL1, DL2, DL3, DL4, DL5, and DL6 neighboring each other. Similarly, the circuitous portions (or curved portions) respectively of the initialization voltage lines VL1, VL2, and VL3 may be located between the scan lines SL1, SL2, SL3, and SL4 neighboring each other in the first non-display area NDA1, for example, between circuitous portions respectively of the scan lines SL1, SL2, SL3, and SL4.

Since the initialization voltage lines VL1, VL2, and VL3 have a constant voltage (e.g. −2V), the coupling between the data lines neighboring each other or the scan lines neighboring each other in the first non-display area NDA1 may be effectively reduced.

Figure 12:
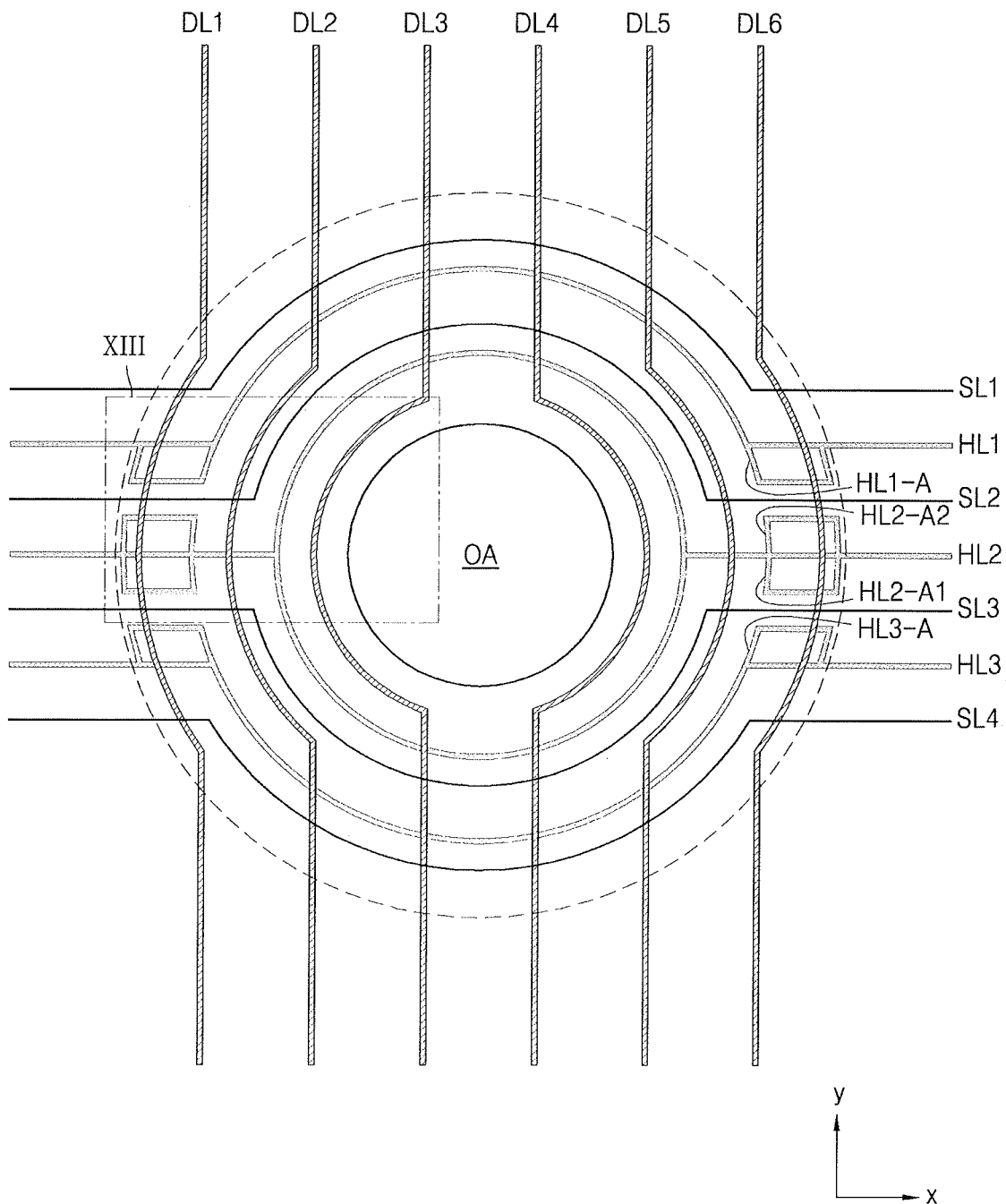
FIG. 12 illustrates a plan view of a display panel according to another embodiment.
Figure 13:
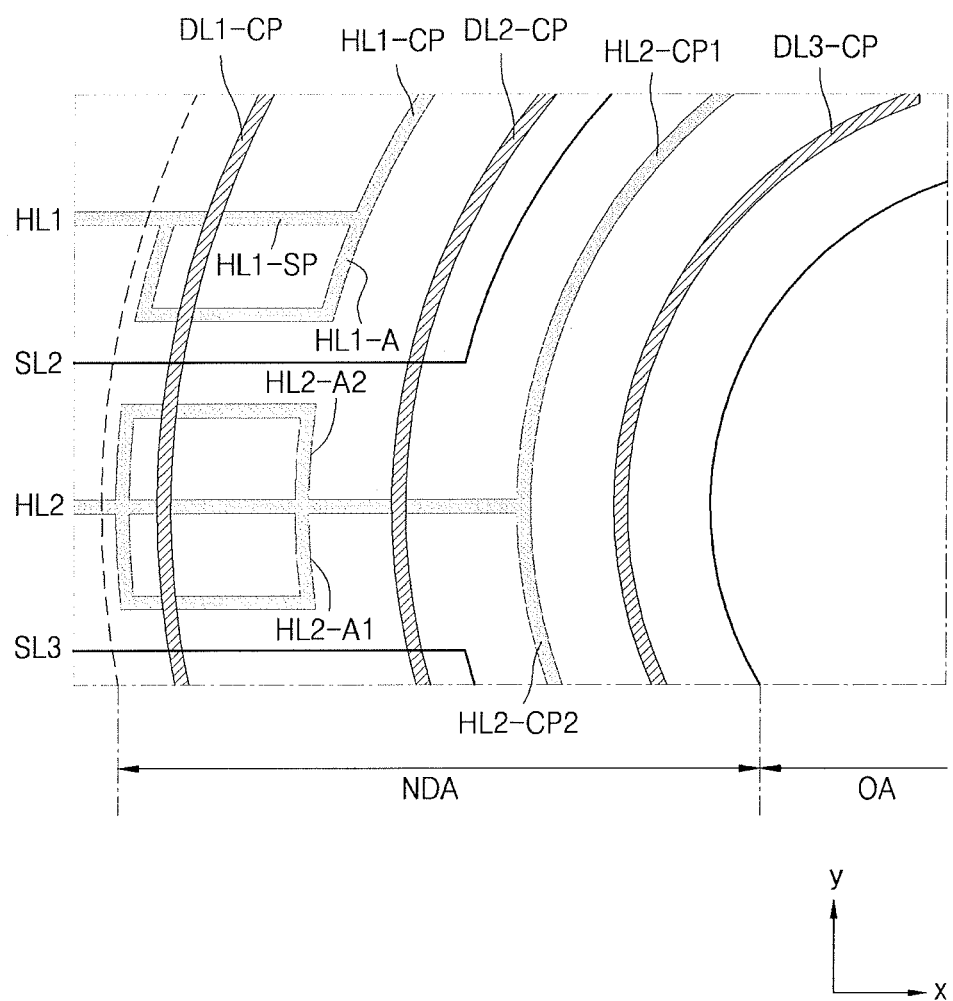
FIG. 13 illustrates an enlarged plan view of portion XIII of FIG. 12.

FIG. 12 is a plan view of a display panel according to another embodiment, and FIG. 13 is an enlarged plan view of a portion XIII of FIG. 12.

The display panel shown in FIG. 12 includes the same structure as the display panel described with reference to FIG. 7, and FIG. 12 illustrates, for convenience of description, scan lines, electrode voltage lines, data lines around the opening area OA. Since the display panel shown in FIG. 12 is different from the display panel described with reference to FIG. 7 in that the electrode voltage line further includes an auxiliary line, differences are mainly described below, for convenience of description.

Referring to FIG. 12, each of the electrode voltage lines that bypass an edge of the opening area OA may further include an auxiliary line. With regard to this, FIG. 12 illustrates that the first to third electrode voltage lines HL1, HL2, and HL3 respectively include auxiliary lines HL1-A, (HL2-A1, HL2-A2), and HL3-A.

As illustrated in FIGS. 12 and 13, in the case where the circuitous portion HL1-CP of the first electrode voltage line HL1 extends to an upper side of the opening area OA, an area of a region between the circuitous portions DL1-CP and DL2-CP respectively of the first and second data lines DL1 and DL2, exists in which the circuitous portion HL1-CP is not arranged. An auxiliary line HL1-A of the first electrode voltage line HL1 may be located in the area in which the circuitous portion HL1-CP is not arranged so as to reduce or suppress the occurrence of a parasitic capacitance in the relevant area. The auxiliary line HL1-A of the first electrode voltage line HL1 may be located between the first and second data lines DL1 and DL2 and between the fifth and sixth data lines DL5 and DL6.

The auxiliary line HL1-A of the first electrode voltage line HL1 may extend toward a lower direction, which is opposite to the circuitous portion HL1-CP, between the auxiliary line HL1-A of the first electrode voltage line HL1 and the second electrode voltage line HL2 adjacent thereto, and may be bent and connected with an extended portion HL1-SP (see FIG. 13) to form a closed curve. In the case where the auxiliary line HL1-A does not form a closed loop with another portion, the auxiliary line HL1-A itself may serve as a lightning rod and become a progression path of static electricity ESD around the opening area OA. However, in the present embodiment, since the auxiliary line HL1-A forms a closed curve with the extended portion HL1-SP, penetration of static electricity may be prevented.

Likewise, the second electrode voltage line HL2 may include auxiliary lines HL2-A1 and HL2-A2 that respectively extend in opposite directions to circuitous portions HL2-CP1 and HL2-CP2. The auxiliary lines HL2-A1 and HL2-A2 of the second electrode voltage line HL2 may be spaced apart from the circuitous portions HL2-CP1 and HL2-CP2 by a predetermined interval and may reduce the occurrence of a parasitic capacitance between the first and second data lines DL1 and DL2. Also, the auxiliary lines HL2-A1 and HL2-A2 of the second electrode voltage line HL2 may be located between the fifth and sixth data lines DL5 and DL6 in an area between the second electrode voltage line HL2 and an electrode voltage line adjacent thereto (see FIG. 13).

Similarly, an auxiliary line HL3-A of the third electrode voltage line HL3 may be located between the first and second data lines DL1 and DL2 and between the fifth and sixth data lines DL5 and DL6.

Though FIGS. 12 and 13 have described that each of the electrode voltage lines HL1, HL2, and HL3 include an auxiliary line(s), the initialization voltage lines VL1, VL2, and VL3 described above with reference to FIG. 11 may also include the auxiliary line as in FIGS. 12 and 13.

Figure 14:
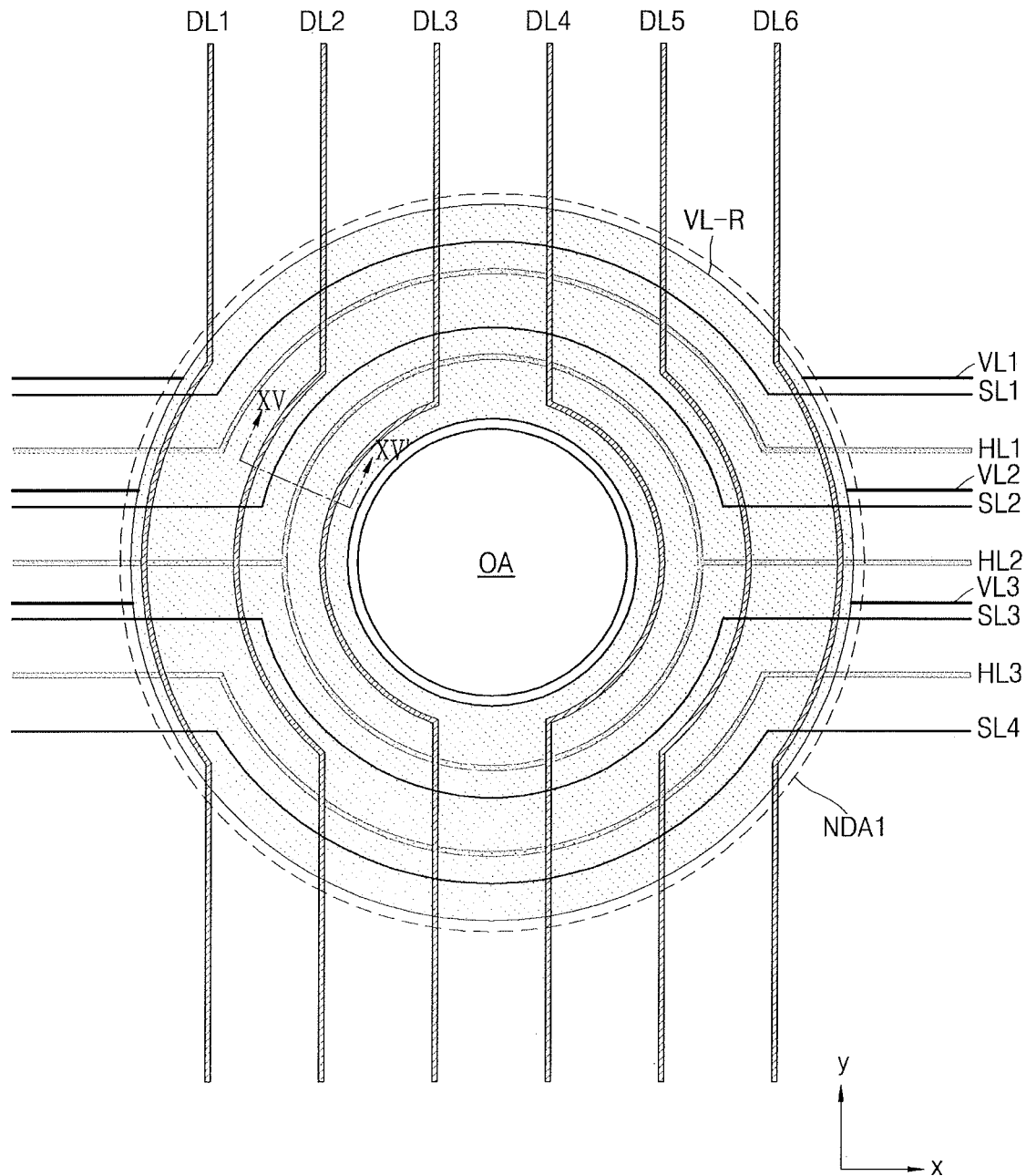
FIG. 14 illustrates a plan view of a display panel according to another embodiment.
Figure 15A:
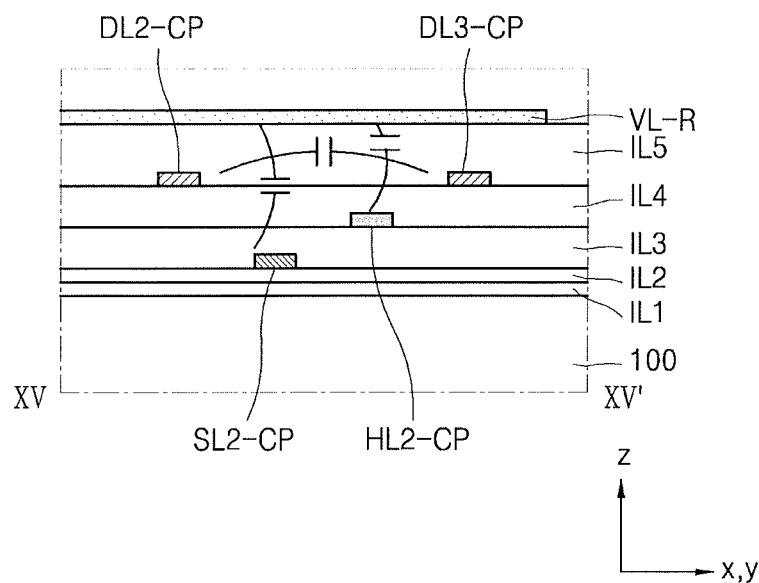
FIGS. 15A and 15B illustrate cross-sectional views of a display panel according to an embodiment along line XV-XV' of FIG. 14.
Figure 15B:
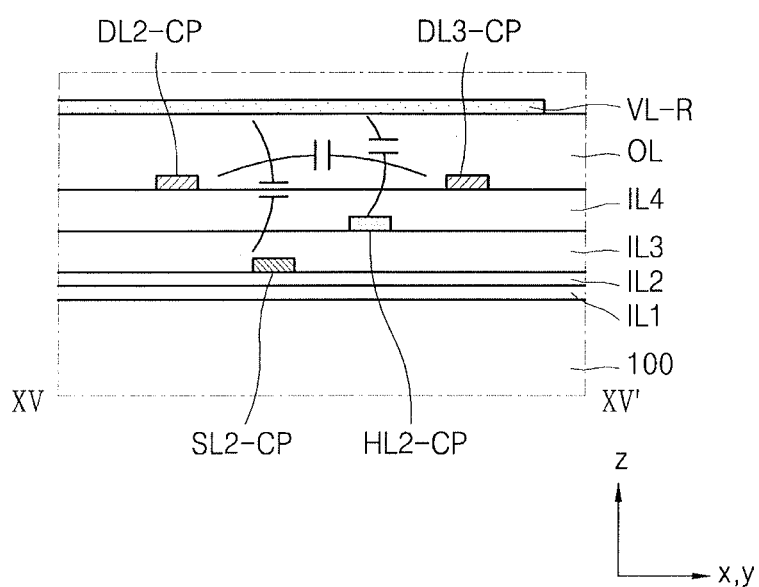

FIG. 14 is a plan view of a display panel according to another embodiment, and FIGS. 15A and 15B are cross-sectional views of a display panel according to an embodiment, taken along a line XV-XV' of FIG. 14.

Referring to FIG. 14, an electrode layer VL-R of a ring shape in which an area corresponding to the opening area OA is open may be arranged in the first non-display area NDA1. The electrode layer VL-R may be connected as one body with the initialization voltage lines VL1, VL2, and VL3 and may have the same voltage level (e.g. a constant voltage) as the initialization voltage lines VL1, VL2, and VL3. The electrode layer VL-R may cover all of the wirings in the first non-display area NDA1.

The electrode layer VL-R may cover the circuitous portions of the scan lines, the electrode voltage lines, and the data lines arranged therebelow. With regard to this, FIG. 14 illustrates that the circuitous portion SL2-CP of the second scan line, the circuitous portion HL2-CP of the second electrode voltage line, and the circuitous portions DL2-CP and DL3-CP of the second and third data lines are covered by the electrode layer VL-R.

Coupling between the data lines neighboring each other in the first non-display area NDA1 may be cancelled by the electrode layer VL-R and a wiring therebelow, for example, the circuitous portion HL2-CP of the second electrode voltage line. For example, as illustrated in FIG. 15A, coupling between the circuitous portions DL2-CP and DL3-CP respectively of the second and third data lines DL2 and DL3 may be cancelled by the electrode layer VL-R and the circuitous portion HL2-CP of the second electrode voltage line HL2 therebelow.

Though FIG. 15A illustrates that the fifth insulating layer IL5, which is an inorganic insulating layer, is arranged between the electrode layer VL-R and the data lines, according to another embodiment, as illustrated in FIG. 15B, an organic insulating layer OL may be arranged between the electrode layer VL-R and the data lines. Alternatively, both an inorganic insulating layer and an organic insulating layer may be provided between the electrode layer VL-R and the data lines.

Figure 16:
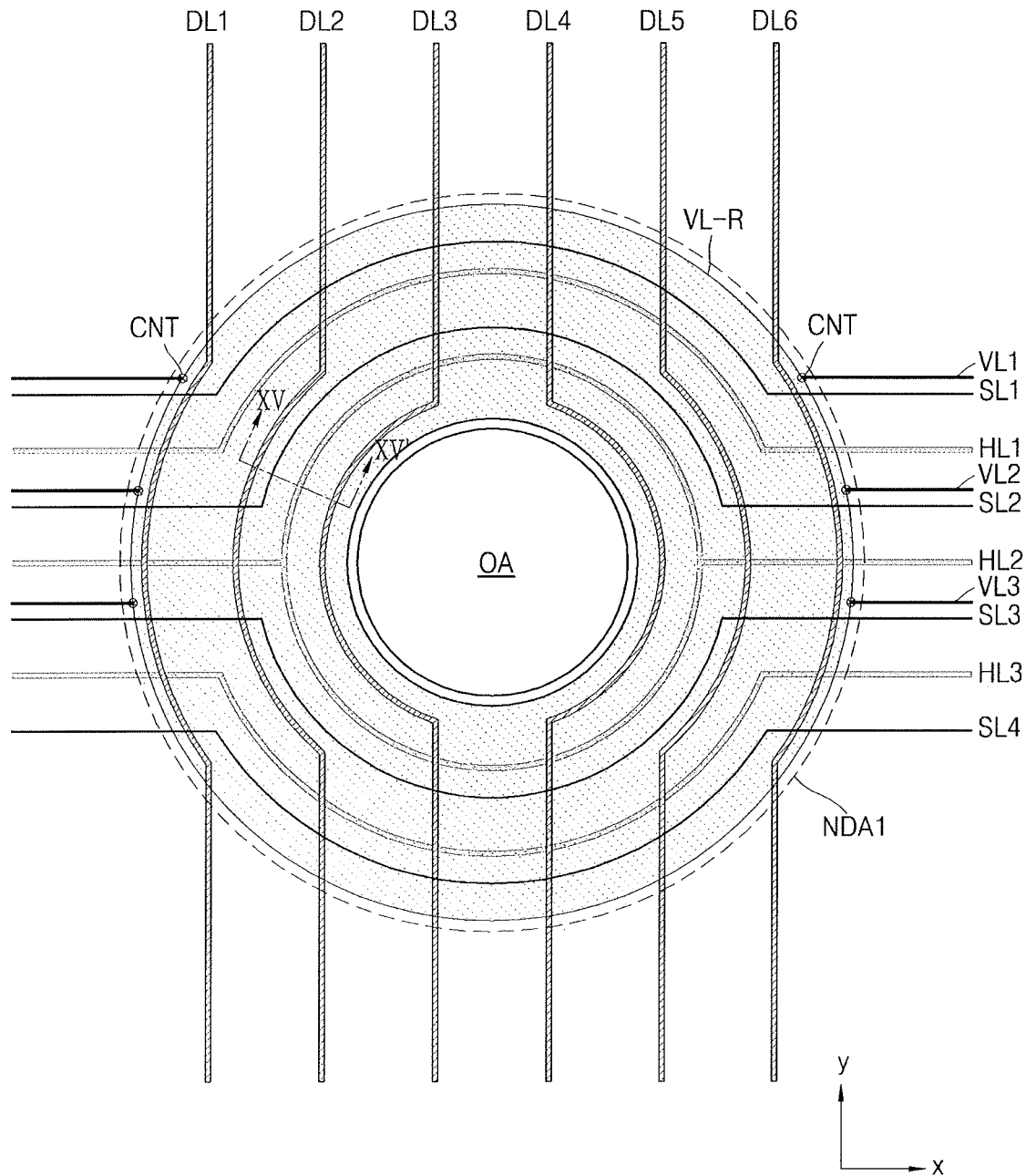
FIG. 16 illustrates a plan view of a display panel according to another embodiment.

FIG. 16 is a plan view of a display panel according to another embodiment.

Though, in the display panel described with reference to FIG. 14, the electrode layer VL-R and the initialization voltage lines VL1, VL2, and VL3 are arranged over the same insulating layer and include the same material, FIG. 16 illustrates, as another embodiment, the electrode layer VL-R and the initialization voltage lines VL1, VL2, and VL3 are arranged over different layers. Differences are mainly described below.

In an embodiment, the electrode layer VL-R may be arranged over the same layer as the pixel electrode 210 (see FIG. 6), and the initialization voltage lines VL1, VL2, and VL3 may be arranged between the substrate and the pixel electrode 210, for example, over the same layer as the electrode voltage line HL (see FIG. 6). In this case, the initialization voltage lines VL1, VL2, and VL3 and the electrode layer VL-R may be electrically connected with each other through a contact hole CNT passing through an insulating layer(s) arranged therebetween.

By way of summation and review, one or more embodiments include, as a method of increasing functionality that may be combined or made cooperate with a display device, a display panel including an opening area for an electronic element, e.g., a camera, a sensor, etc., inside a display area, and a device including the display panel. Further, according to embodiments of the present disclosure, display quality may be improved by reducing or canceling a parasitic capacitance that is generated in wirings around the opening area corresponding to the electronic element such as a sensor or a camera.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
    a substrate including:
        a non-display area surrounding a component area, and
        a display area outside the non-display area;
    a plurality of display elements arranged in the display area;
    a plurality of first lines extending in a first direction in the display area and bypassing the component area in the non-display area;
    a plurality of second lines extending in a second direction in the display area and bypassing the component area in the non-display area, wherein the second direction crosses the first direction; and
    a plurality of third lines extending in the second direction in the display area and bypassing the component area in the non-display area, wherein:
    the plurality of first lines comprises two adjacent first lines each including a circuitous portion located in the non-display area and bypasses the component area to partially surround the component area, and
    a circuitous portion of the at least one of the third lines is between the circuitous portions of the two adjacent first lines in the non-display area and partially surrounds the component area.

2. The display panel as claimed in claim 1, wherein:
    the plurality of first lines comprises a plurality of first signal lines, and the plurality of second lines comprises a plurality of second signal lines different from the first signal lines, and
    at least one of the plurality of second lines includes a circuitous portion located between the two adjacent first lines in the non-display area.

3. The display panel as claimed in claim 2, wherein the circuitous portion of the at least one of the plurality of third lines is spaced apart from the circuitous portion of the at least one of the plurality of second lines.

4. The display panel as claimed in claim 2, wherein:
    the plurality of first signal lines comprises a plurality of data lines, and the plurality of second signal lines comprises a plurality of scan lines.

5. The display panel as claimed in claim 1, wherein the plurality of third lines each has a constant voltage bevel.

6. The display panel as claimed in claim 1, further comprising:
    a plurality of pixel circuits each being electrically connected to the plurality of display elements, wherein:

each of the plurality of pixel circuits comprises a transistor and a storage capacitor including a lower capacitor electrode and a upper capacitor electrode, and the plurality of third lines comprises the upper capacitor electrode.

7. The display panel as claimed in claim 1, further comprising:
a plurality of driving voltage lines extending in a first direction and electrically connected to the plurality of third lines in the display area,
wherein the plurality of driving voltage lines and the plurality of third lines form a mesh structure.

8. The display panel as claimed in claim 7, wherein the plurality of driving voltage lines and the plurality of third lines are disposed on different layers from each other.

9. The display panel as claimed in claim 1, wherein the at least one of the plurality of third lines further includes an auxiliary line in the non-display area, wherein the auxiliary line includes a portion that extends in a direction opposite to a direction of the circuitous portion and is connected to the at least one of the plurality of third lines.

10. The display panel as claimed in claim 1, further comprising:
an encapsulation substrate facing the substrate, wherein the encapsulation substrate covers the display area, the non-display area, and the component area.

11. The display panel as claimed in claim 10, further comprising:
a sealing material between the substrate and the encapsulation substrate and surrounding the component area,
wherein the sealing material overlaps a portion of at least one selected from the plurality of first lines, the plurality of second lines, and the plurality of third lines.

12. The display panel as claimed in claim 1, further comprising:
an electrode layer in the non-display area,
wherein the electrode layer includes a hole corresponding to the component area, and the electrode layer covers at least a part of the plurality of first lines, at least a part of the plurality of second lines, and/or at least a part of the plurality of third lines.

13. The display panel as claimed in claim 12, wherein the electrode layer has a constant voltage level.

14. A display device, comprising:
a display panel, comprising:
a substrate including:
a non-display area surrounding a component area, and
a display area surrounding the non-display are;
a plurality of display elements arranged in the display area;
a plurality of voltage lines each having a constant voltage, the plurality of voltage lines being arranged on the substrate and bypassing the component area in the non-display area;
a plurality of signal lines arranged on the substrate and bypassing the component area in the non-display area; and
an encapsulation member covering the plurality of display elements, wherein at least one of the plurality of voltage lines includes a circuitous portion located between two adjacent signal lines of the plurality of signal lines in the non-display area, and
a component corresponding to the component area.

15. The display device as claimed in claim 14, wherein the component is under the substrate.

16. The display device as claimed in claim 14, wherein the component comprises a sensor or a camera.

17. The display device as claimed in claim 14, wherein the display panel further comprises:
a plurality of pixel circuits each being electrically connected to the plurality of display elements, wherein:
each of the plurality of pixel circuits comprises a transistor and a storage capacitor including a lower capacitor electrode and a upper capacitor electrode, and
the plurality of voltage lines comprises the upper capacitor electrode.

18. The display device as claimed in claim 14, wherein the display panel further comprises:
a plurality of driving voltage lines extending in a first direction and electrically connected to the plurality of voltage lines in the display area, wherein
the plurality of driving voltage lines and the plurality of voltage lines form a mesh structure.

19. The display panel as claimed in claim 18, wherein the plurality of driving voltage lines and the plurality of voltage lines are disposed on different layers from each other.

20. The display device as claimed in claim 14, wherein the plurality of signal lines include a plurality of data lines or a plurality of scan lines.

21. The display device as claimed in claim 14, wherein the at least one of the plurality of voltage lines further includes an auxiliary line in the non-display area, wherein the auxiliary line includes a portion that extends in a direction opposite to a direction of the circuitous portion and is connected to the at least one of the plurality of voltage lines.

22. The display device as claimed in claim 14, wherein the encapsulation member comprises an encapsulation substrate facing the substrate, wherein the encapsulation substrate covers the display area, the non-display area, and the component area.

23. The display device as claimed in claim 22, wherein the display panel further comprises:
a sealing material between the substrate and the encapsulation substrate and surrounding the component area, wherein
the sealing material overlaps a portion of at least one selected from the plurality of single lines and the plurality of voltage lines.

24. The display device as claimed in claim 14, wherein the display panel further comprises:
an electrode layer in the non-display area,
wherein the electrode layer includes a hole corresponding to the component area, and the electrode layer covers at least a part of the plurality of signal lines and/or at least a part of the plurality of voltage lines.

25. The display device as claimed in claim 24, wherein the electrode layer has a constant voltage level.

* * * * *